(12) United States Patent
Shim et al.

(10) Patent No.: US 10,276,737 B2
(45) Date of Patent: Apr. 30, 2019

(54) SOLAR CELL AND SOLAR CELL MODULE

(71) Applicant: LG ELECTRONICS INC., Seoul (KR)

(72) Inventors: Seunghwan Shim, Seoul (KR); Ilhyoung Jung, Seoul (KR); Jinah Kim, Seoul (KR); Hwanyeon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 65 days.

(21) Appl. No.: 15/159,430

(22) Filed: May 19, 2016

(65) Prior Publication Data
US 2016/0343894 A1   Nov. 24, 2016

(30) Foreign Application Priority Data

May 20, 2015 (KR) .......................... 10-2015-0070183
May 26, 2015 (KR) .......................... 10-2015-0073015

(51) Int. Cl.
*H01L 31/05* (2014.01)
*H01L 31/0224* (2006.01)
(Continued)

(52) U.S. Cl.
CPC ...... *H01L 31/05* (2013.01); *H01L 31/022425* (2013.01); *H01L 31/022441* (2013.01);
(Continued)

(58) Field of Classification Search
CPC ............ H01L 31/05; H01L 31/022425; H01L 31/022441; H01L 31/022466; H01L 31/068; H01L 31/0747
(Continued)

(56) References Cited

U.S. PATENT DOCUMENTS

2006/0130891 A1* 6/2006 Carlson ............. H01L 31/02168
136/256
2007/0295399 A1 12/2007 Carlson
(Continued)

FOREIGN PATENT DOCUMENTS

JP     2002-532888 A    10/2002
JP     2008-85374 A      4/2008
(Continued)

*Primary Examiner* — Matthew T Martin
(74) *Attorney, Agent, or Firm* — Birch, Stewart, Kolasch & Birch, LLP

(57) ABSTRACT

A solar cell and a solar cell module are disclosed. The solar cell includes a semiconductor substrate containing a crystalline silicon material, a first conductive region on a back surface of the semiconductor substrate, a second conductive region positioned in a portion except the first conductive region from the back surface of the semiconductor substrate and having a conductive type opposite the first conductive region, a first electrode connected to the first conductive region, and a second electrode connected to the second conductive region. The back surface of the semiconductor substrate is divided into a first area extending in one direction at an edge of the entire back surface of the semiconductor substrate and a second area occupying a portion except the first area from the entire back surface of the semiconductor substrate.

29 Claims, 28 Drawing Sheets

(51) Int. Cl.
  *H01L 31/0747* (2012.01)
  *H01L 31/068* (2012.01)
(52) U.S. Cl.
  CPC .... *H01L 31/022466* (2013.01); *H01L 31/068* (2013.01); *H01L 31/0747* (2013.01); *Y02E 10/50* (2013.01)
(58) Field of Classification Search
  USPC ........................................................ 136/256
  See application file for complete search history.

(56) References Cited

U.S. PATENT DOCUMENTS

| | | |
|---|---|---|
| 2010/0029039 A1 | 2/2010 | Shan et al. |
| 2012/0167978 A1 | 7/2012 | Shin et al. |
| 2014/0366928 A1* | 12/2014 | Niinobe .............. H01L 31/0516 136/246 |
| 2014/0373896 A1 | 12/2014 | Matsuura et al. |

FOREIGN PATENT DOCUMENTS

| | | |
|---|---|---|
| JP | 2008-519438 A | 6/2008 |
| JP | 2014-7384 A | 1/2014 |
| JP | 2014-183073 A | 9/2014 |

\* cited by examiner

SOLAR CELL AND SOLAR CELL MODULE

CROSS-REFERENCE TO RELATED APPLICATION

This application claims priority to and the benefit of Korean Patent Application No. 10-2015-0070183 filed in the Korean Intellectual Property Office on May 20, 2015 and Application No. 10-2015-0073015 filed in the Korean Intellectual Property Office on May 26, 2015. The entire contents of these applications are incorporated herein by reference.

BACKGROUND OF THE INVENTION

Field of the Invention

Embodiments of the present invention relate to a solar cell and a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is provided a solar cell including a semiconductor substrate containing a crystalline silicon material, a first conductive region on a back surface of the semiconductor substrate, a second conductive region positioned in a portion except the first conductive region from the back surface of the semiconductor substrate and having a conductive type opposite the first conductive region, a first electrode connected to the first conductive region, and a second electrode connected to the second conductive region, wherein the back surface of the semiconductor substrate is divided into a first area extending in one direction at an edge of the entire back surface of the semiconductor substrate and a second area occupying a portion except the first area from the entire back surface of the semiconductor substrate, wherein the first electrode is formed in the first and second areas, and a portion of the first electrode is exposed to at least a portion of the first area, and wherein the second electrode is separated from the first electrode in the second area and is exposed to at least a portion of the second area.

The first electrode may include a first electrode layer that is entirely formed in the first and second areas and includes a plurality of openings in the second area. The second electrode may include a second electrode layer that is connected to the second conductive region through the plurality of openings of the first electrode layer of the second area, is separated from the first electrode layer of the second area, and is stacked on the first electrode layer of the second area in a surface shape.

A portion of the first electrode layer may be exposed to at least a portion of the first area, and the second electrode layer may be formed in at least a portion of the second area.

The first electrode may further include a first transparent electrode layer between the first electrode layer and the first conductive region. The second electrode may further include a plurality of second transparent electrode layers between the second electrode layer and the second conductive region.

The first electrode layer and the first transparent electrode layer may have the same pattern when viewed from a plane of the semiconductor substrate.

A second transparent electrode layer may be formed inside an opening of the first transparent electrode layer positioned in the second area and may be connected to the second conductive region.

An insulating layer may be positioned in the second area of the semiconductor substrate, to which the plurality of second transparent electrode layers is exposed.

The plurality of second transparent electrode layers may be separated from one another to have a lattice arrangement.

The first conductive region may be entirely formed in the first and second areas and may include a plurality of openings in the second area. The second conductive region may be formed inside the plurality of openings of the first conductive region positioned in the second area.

Each of the first and second conductive regions may include one of an amorphous silicon, a single crystal silicon, a polycrystalline silicon, or a metal oxide.

The insulating layer may be positioned in a space between the first electrode layer and the second electrode layer that are separated from each other and are stacked in the second area.

The solar cell may further include a tunnel layer between the entire back surface of the semiconductor substrate and front surfaces of the first and second conductive regions, so that carriers produced in the semiconductor substrate pass through the tunnel layer.

A thickness of the insulating layer may be greater than a thickness of the tunnel layer.

Each of the first and second transparent electrode layers may include a transparent conductive oxide. Each of the first and second transparent electrode layers may have a thickness of 10 nm to 100 nm.

A thickness of each of the first and second electrode layers may be greater than a thickness of each of the first and second transparent electrode layers and may be 100 nm to 5 μm.

The first conductive region may be entirely formed in the first area and may extend in one direction in the second area. The second conductive region may be adjacent to the first conductive region in the second area and may extend in parallel with the first conductive region.

The first transparent electrode layer may be connected to the first conductive region while overlapping the first conductive region, may be entirely formed in the first area, and may extend in one direction in the second area. The second transparent electrode layer may be connected to the second conductive region while overlapping the second conductive region in the second area, and may be separated from the first transparent electrode layer, and may extend.

In another aspect, there is provided a solar cell module including a plurality of solar cells each having a structure according to claim 1 and arranged in a first direction, and an interconnector connecting first and second solar cells, that are adjacently arranged in the first direction among the plurality of solar cells, in series to each other, wherein one end of the interconnector is connected to a portion of a first electrode exposed to a first area of the first solar cell while overlapping the portion of the first electrode, and the other end of the interconnector is connected to a second electrode exposed to a second area of the second solar cell while overlapping the second electrode.

A length of the interconnector, in the first direction, overlapping the first area of the first solar cell may be different from a length of the interconnector, in the first direction, overlapping the second area of the second solar cell.

When the first and second electrodes respectively includes first and second electrode layers that are separated from each other and are stacked in a surface shape, the interconnector may include a first direction conductor extending in the first direction. One end of the first direction conductor may be connected to the first electrode layer exposed to the first area of the first solar cell, and the other end of the first direction conductor may be connected to the second electrode layer formed in the second area of the second solar cell.

The first direction conductor may be a plurality of first direction conductors. An overlap length between one end of one of the plurality of first direction conductors and the first area of the first solar cell may be different from an overlap length between the other end of the one first direction conductor and the second area of the second solar cell.

The interconnector may further include two second direction conductors that are formed respectively at both ends of the first direction conductor and extend in a second direction. The first and second direction conductors may be formed as one body.

The two second direction conductors connected respectively to both ends of the first direction conductor may have the same width.

One first direction conductor may be provided. A width of one of the two second direction conductors connected respectively to both ends of the first direction conductor may be different from a width of the other of the two second direction conductors.

The second electrode of each of the first and second solar cells may be exposed to a portion of the second area.

An insulating layer may cover a remaining portion except a portion, to which the second electrode is exposed, from the second area of a semiconductor substrate.

The interconnector may have a surface shape. One end of the interconnector of the surface shape may be connected to a first electrode layer exposed to the first area of one of the first and second solar cells. The other end of the interconnector may be connected to a portion of a second electrode layer exposed to a portion of the second area of the other solar cell.

The interconnector of the surface shape may include a plurality of openings in a portion not overlapping the first and second solar cells.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
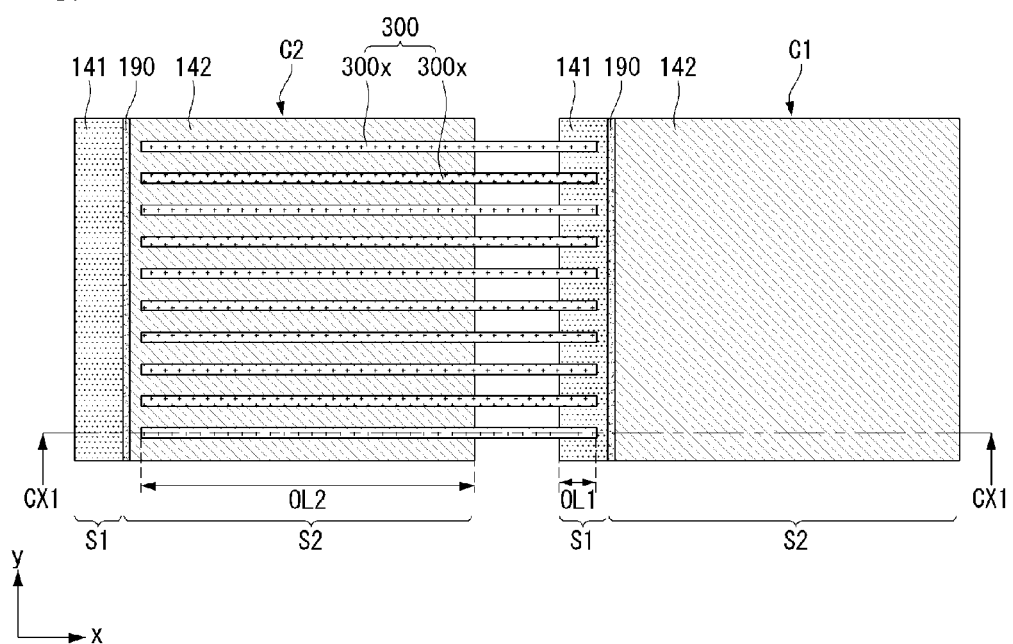
FIGS. 1 to 9 illustrate a solar cell module according to a first embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

In the following description, the fact that any two values are substantially equal to each other means that the two values are equal to each other within a margin of error of 10% or less.

In the following description, a first conductive region and a second conductive region are interpreted as regions having opposite conductive types. For example, if the first conductive region is a p-type region, in which holes operate as majority carriers, the second conductive region may be an n-type region, in which electrons operate as majority carriers. On the contrary, if the first conductive region is an n-type region, the second conductive region may be a p-type region. Conductive types of the first conductive region and the second conductive region may be determined depending on whether a silicon wafer used as a semiconductor substrate is of an n-type or a p-type.

In the following description, a pad included in each of first and second electrodes means, when two adjacent solar cells are electrically connected to each other using an interconnector, a portion of each of the first and second electrodes that is electrically connected to the interconnector.

FIGS. 1 to 9 illustrate a solar cell module according to a first embodiment of the invention.

Figure 2:
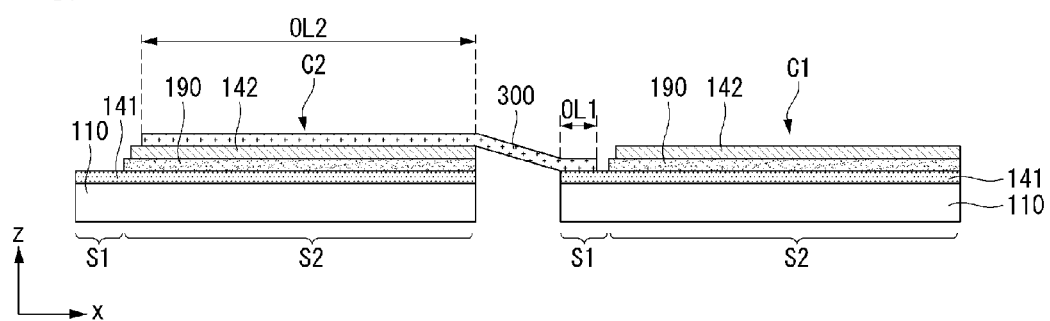

More specifically, FIG. 1 illustrates the solar cell module according to the first embodiment of the invention when viewed from a back surface, and FIG. 2 is a cross-sectional view taken along line CX1-CX1 of FIG. 1.

Figure 3:
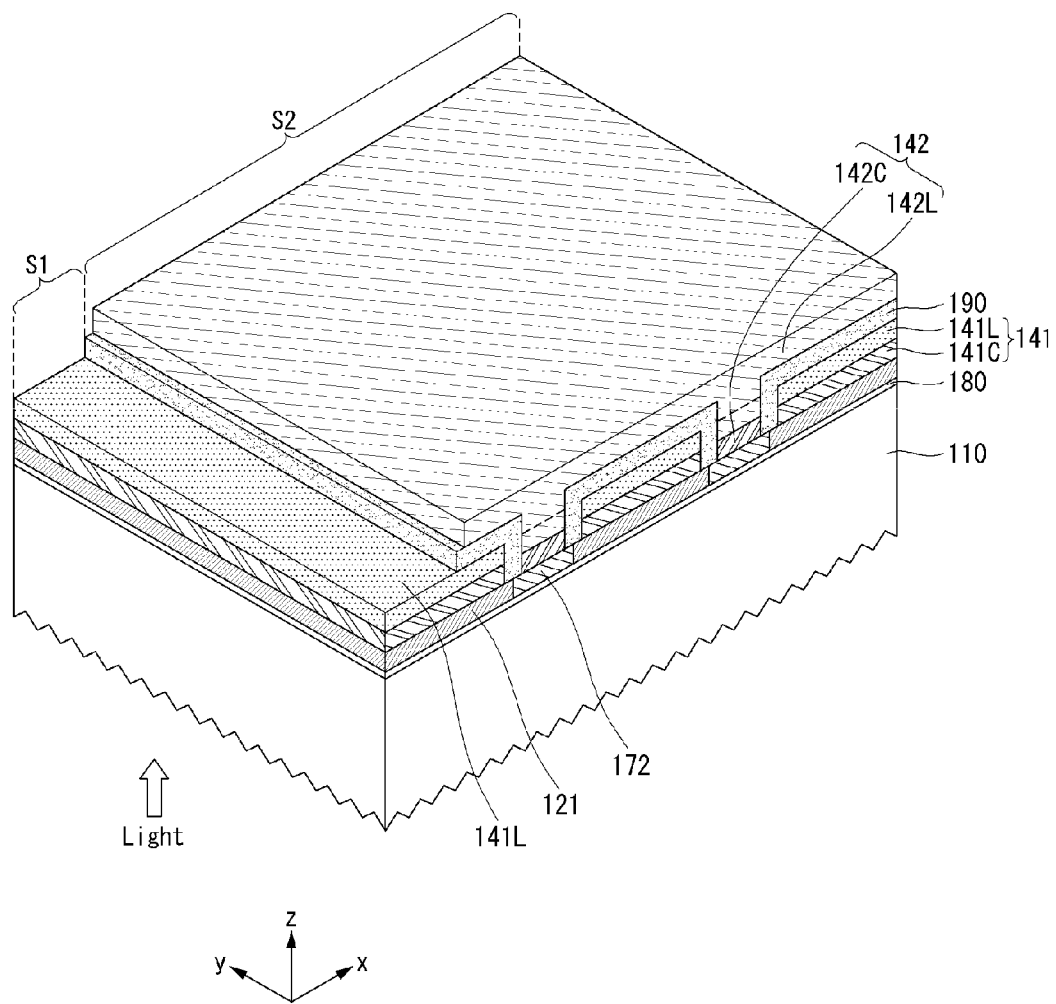
Figure 4:
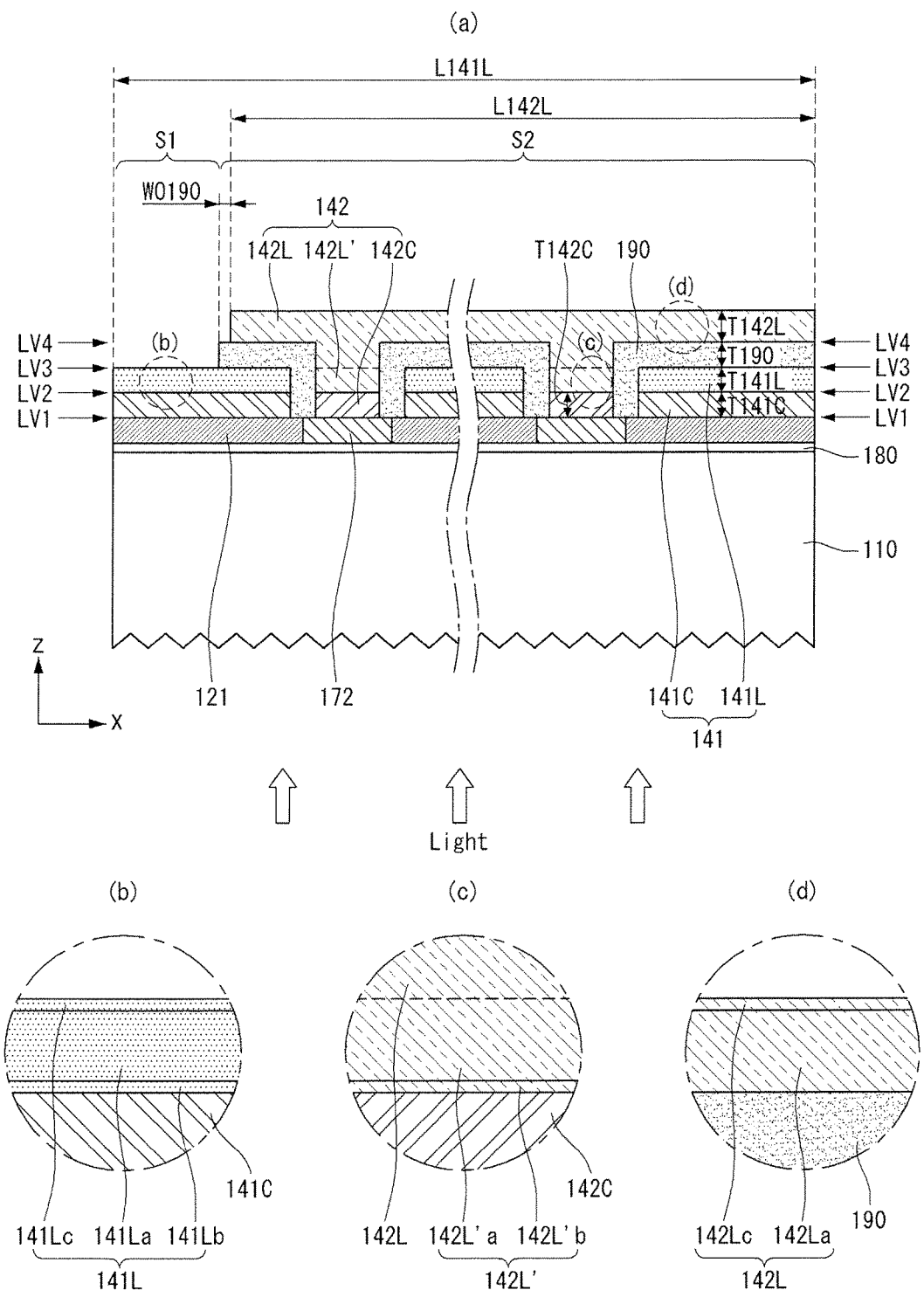

FIGS. 3 and 4 illustrate a solar cell according to an embodiment of the invention. More specifically, FIG. 3 is a partial perspective view of one side of a solar cell, in which a first electrode is exposed. In FIG. 4, (a) is an entire cross-sectional view taken along the first direction x of the solar cell, and (b) to (d) are enlarged views of (b) to (d) shown in (a) of FIG. 4.

Figure 7:
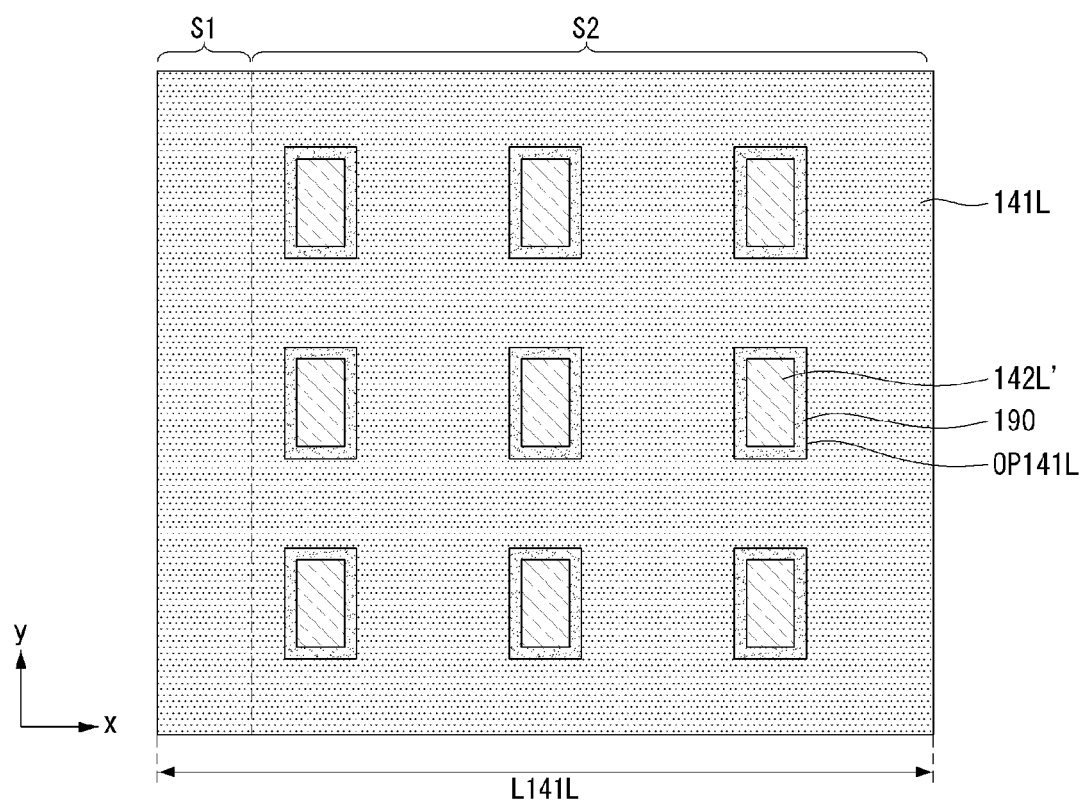

(b) to (d) of FIG. 4 are described while describing the drawings subsequent to FIG. 7.

As shown in FIGS. 1 and 2, the solar cell module according to the first embodiment of the invention includes first and second solar cells C1 and C2 and an interconnector 300.

Each of the first and second solar cells C1 and C2 may include a semiconductor substrate 110, a first conductive region 121, a second conductive region 172, a first electrode 141, and a second electrode 142. As shown in FIG. 1, the first and second solar cells C1 and C2 may be horizontally arranged in a first direction x (for example, an x-axis direction) and may be electrically connected to each other by the interconnector 300 extending in the first direction x.

A back surface of the semiconductor substrate 110 included in each of the first and second solar cells C1 and C2 may be divided into a first area S1 and a second area S2.

In the embodiment disclosed herein, the first area S1 may occupy one edge of the entire back surface of the semiconductor substrate 110, and the second area S2 may occupy a remaining area except the first area S1 from the entire back surface of the semiconductor substrate 110.

For example, referring to FIG. 1, the first area S1 may be positioned at one edge of the entire back surface of the semiconductor substrate 110 to extend in a second direction y (for example, a y-axis direction) crossing the first direction x while a boundary line between the first area S1 and the second area S2 extends in the second direction y. The second area S2 may be positioned in a remaining area except the first area S1 from the entire back surface of the semiconductor substrate 110.

In each of the first and second solar cells C1 and C2, the first electrode 141 may be formed in both the first area S1 and the second area S2, and a portion of the first electrode 141 may be exposed to at least a portion of the first area S1.

Further, the second electrode 142 may be formed in the second area S2, and a portion of the second electrode 142 may be exposed to at least a portion of the second area S2.

A portion of the first electrode 141 exposed to the first area S1 of the semiconductor substrate 110 may serve as a first electrode pad electrically connected to the interconnector 300. A portion of the second electrode 142 exposed to the second area S2 of the semiconductor substrate 110 may serve as a second electrode pad electrically connected to the interconnector 300.

For example, as shown in FIGS. 1 and 2, in each of the first and second solar cells C1 and C2, the first electrode 141 may include a first electrode layer 141L (refer to FIG. 3) formed on the first and second areas S1 and S2 of the back surface of the semiconductor substrate 110 in a surface shape. Further, the second electrode 142 may include a second electrode layer 142L (refer to FIG. 3) of a surface shape separated from the first electrode layer 141L in a third direction z (for example, a z-axis direction) vertical to the first and second directions x and y while overlapping the first electrode layer 141L on the back surface of the semiconductor substrate 110.

FIGS. 1 and 2 illustrate that a portion of the first electrode layer 141 (141L of FIG. 3) is exposed to an entire portion of the first area S1 and the portion of the first electrode layer 141 (141L of FIG. 3) exposed in the first area S1 is extending in the second direction y, so as to serve as the first electrode pad, as an example. The embodiment of the invention is not limited thereto, and other configurations may be used. For example, a portion of the first electrode layer 141 (141L of FIG. 3) may be exposed only to a portion of the first area S1, or a plurality of portions of the first electrode layer 141 (141L of FIG. 3) may be exposed to the first area S1 to be separated from one another in the second direction y, or an insulating layer 190 may be positioned in a portion of the first electrode layer 141 (141L of FIG. 3) that is not exposed to the first area S1.

The insulating layer 190 may be positioned in a separation space, in the third direction z, between the first electrode layer 141L and the second electrode layer 142L to insulate the first electrode layer 141L from the second electrode layer 142L.

A cell structure having the semiconductor substrates 110, the first conductive regions 121, the second conductive regions 172, the insulating layers 190, the first electrodes 141 connected to the first conductive regions 121 the second electrodes 142 connected to the second conductive regions 172, are described in detail below with reference to FIGS. 3 to 9.

FIGS. 1 and 2 illustrate that the first electrode 141 includes the first electrode layer 141L, and the second electrode 142 includes the second electrode layer 142L, as an example. The embodiment of the invention is not limited thereto, and other configurations may be used. For example, only the first electrode 141 may include the first electrode layer 141L, and the second electrode 142 may not include the second electrode layer 142L depending on a shape of the interconnector 300 applied to the solar cell module.

An example where only the first electrode 141 includes the first electrode layer 141L and the second electrode 142 does not include the second electrode layer 142L is described in detail later with reference to the drawings subsequent to FIG. 13.

As shown in FIGS. 1 and 2, when the first electrode 141 includes the first electrode layer 141L and the second electrode 142 includes the second electrode layer 142L, a portion of the first electrode layer 141L, which is positioned to extend in the second direction y in the first area S1 and is exposed to the first area S1, may serve as the first electrode pad, and a portion of the second electrode layer 142L, which is formed in the second area S2 of the back surface of the semiconductor substrate 110, may serve as the second electrode pad.

Hence, the portion of the first electrode layer 141L serving as the first electrode pad may be elongatedly exposed in the second direction y while being positioned on one side of the back surface of the semiconductor substrate 110 parallel to the second direction y, and may not be exposed to the other side of the back surface of the semiconductor substrate 110 parallel to the second direction y.

Further, the portion of the second electrode layer 142L serving as the second electrode pad may be exposed to the second area S2 (in which the first electrode layer 141L is not exposed) of the back surface of the semiconductor substrate 110.

As shown in FIG. 3, because the second electrode layer 142L is formed on the insulating layer 190 on the first electrode layer 141L, the first electrode layer 141L and the second electrode layer 142L may be formed on different stratums. Thus, a height from the back surface of the semiconductor substrate 110 to a back surface of the first electrode layer 141L may be different from a height from the back surface of the semiconductor substrate 110 to a back surface of the second electrode layer 142L.

Hence, as shown in FIG. 2, the interconnector 300 may extend in the first direction x and may be connected to the first electrode pad of the first electrode layer 141L by slightly bending from an end of the second electrode layer 142L.

On the contrary, the second electrode layer 142L may not be formed on the insulating layer 190 or may not be formed in the surface shape. The second electrode layer 142L may be patterned in a predetermined shape and may serve as the second electrode pad. This is described later.

The interconnector 300 may connect the first and second solar cells C1 and C2 in series to each other. Namely, one end of the interconnector 300 may overlap the first electrode 141, which is positioned in the first area S1 of the first solar cell C1 to extend in the second direction y and is exposed to the first area S1, and may be connected to the first electrode 141. The other end of the interconnector 300 may overlap the second electrode 142 elongatedly exposed to the second area S2 of the second solar cell C2 and may be connected to the second electrode 142.

More specifically, the interconnector 300 may include a plurality of first direction conductors 300x extending in the first direction x. One end of each of the plurality of first direction conductors 300x may be connected to the first electrode pad of the first electrode layer 141L exposed to the first area S1 of the first solar cell C1, and the other end may be connected to the second electrode pad of the second electrode layer 142L exposed to the second area S2 of the second solar cell C2.

The interconnector 300 may be configured such that a coating layer containing tin (Sn)-based material having a good adhesive strength is coated on a surface of a core with high conductivity, for example, copper (Cu).

The interconnector 300 may be connected to the first electrode 141 of the first solar cell C1 and the second electrode 142 of the second solar cell C2 using a conductive adhesive.

The conductive adhesive may be formed of a metal material including tin (Sn) or Sn-containing alloy.

More specifically, the conductive adhesive may be formed of a solder paste including tin (Sn) or Sn-containing alloy. Alternatively, the conductive adhesive may be formed of an epoxy solder paste or a conductive paste, in which tin (Sn) or Sn-containing alloy is included in an epoxy or resin.

As described above, the solar cell module according to the embodiment of the invention is configured such that the interconnector 300 is connected to the first and second electrode layers 141L and 142L exposed to the first and second areas S1 and S2 of the first and second solar cells C1 and C2. Hence, the manufacturing process of the solar cell module can be more easily performed, and efficiency of the solar cell module can be further improved.

Namely, when each of the first and second electrodes of each solar cell includes a finger electrode extending in one direction and a bus bar crossing the finger electrode, the interconnector 300 has to be accurately aligned with the bus bar of each solar cell and connected to the bus bars. Thus, the accurate alignment may be required in the manufacturing process of the solar cell module.

However, in the embodiment of the invention, because the first and second areas S1 and S2 of the semiconductor substrate 110 connected to the interconnector 300 are relatively wide, the accurate alignment may not be required.

Thus, because the solar cell module according to the embodiment of the invention does not require the accurate alignment, the embodiment of the invention may connect the interconnector 300 to the first and second electrodes 141 and 142 exposed to the first and second areas S1 and S2 of the first and second solar cells C1 and C2 in a lamination process for modularizing a plurality of solar cells in a state where the interconnector 300 is previously formed on a filling sheet, such as ethyl vinyl acetate (EVA). Hence, the manufacturing process of the solar cell module can be further simplified.

Further, when each of the first and second electrodes of each solar cell includes a finger electrode and a bus bar, the interconnector 300 is connected to each of the bus bars of each solar cell, and the interconnector 300 has a narrow width. Thus, a serial resistance of the interconnector 300 may relatively increase.

However, in the embodiment of the invention, because the interconnector 300 includes the plurality of first direction conductors 300x extending in the first direction x, a resistance of the interconnector 300 can be greatly reduced. Hence, a short circuit current of the solar cell module can be further improved, and the efficiency of the solar cell module can be further improved.

Because the interconnector 300 is formed as not one conductor of a surface shape but the plurality of first direction conductors 300x extending in the first direction x, a thermal expansion stress generated by stretching the interconnector 300 in the first direction x can be minimized in a thermal processing operation of a tabbing process for connecting the interconnector 300 to each solar cell.

In this instance, as shown in FIGS. 1 and 2, a length OL1 of the interconnector 300, in the first direction x, overlapping the first area S1 of the first solar cell C1 may be different from a length OL2 of the interconnector 300, in the first direction x, overlapping the second area S2 of the second solar cell C2.

Namely, an overlapping length OL1 between one of the plurality of first direction conductors 300x and the first area S1 (or the first electrode layer 141L) of the second solar cell C2 may be different from an overlapping length OL2 between the one first direction conductor 300x and the second area S2 (or the second electrode layer 142L) of the first solar cell C1.

In this instance, the length OL1 of the interconnector 300 overlapping the first area S1 of the second solar cell C2 may be 1/40 to 1/4 of the length OL2 of the interconnector 300 overlapping the second area S2 of the first solar cell C1.

When the length OL1 is equal to or greater than 1/40 of the length OL2, a minimum physical adhesive strength between the interconnector 300 and the first electrode layer 141L may be secured. When the length OL1 is equal to or less than 1/4 of the length OL2, a minimum short circuit current capable of maintaining the efficiency of the solar cell module may be secured, since efficiency of the short circuit current of the solar cell module may vary depending on an area of the first electrode layer 141L exposed to the first area S1 of the back surface of the semiconductor substrate 110 and a location of an end portion of the second electrode layer 142L formed in the second area S2, So far, the first embodiment of the invention described the first and second electrode layers 141L and 142L exposed to the first and second areas S1 and S2 of the first and second solar cells C1 and C2 and the interconnector 300 connected thereto. The solar cell applied to the first embodiment of the invention is described in detail below.

As shown in FIG. 3 and (a) of FIG. 4, a solar cell according to an embodiment of the invention may include a semiconductor substrate 110, a tunnel layer 180 on a back surface of the semiconductor substrate 110, a first conductive region 121, a second conductive region 172, an insulating layer 190, a first electrode 141, and a second electrode 142.

In the embodiment disclosed herein, the tunnel layer 180 may be omitted, if desired or necessary. The embodiment of the invention is described using the solar cell including the tunnel layer 180 as an example.

The semiconductor substrate 110 may be formed of at least one of a single crystal silicon and a polycrystalline silicon containing impurities of a first conductive type or impurities of a second conductive type. For example, the semiconductor substrate 110 may be formed of a single crystal silicon wafer.

In the embodiment disclosed herein, the first conductive type may be one of an n-type and a p-type, and the second conductive type may be a conductive type opposite the first conductive type.

For example, when the first conductive type is the n-type, the second conductive type may be the p-type, and vice versa.

Thus, the semiconductor substrate 110 may be doped with n-type impurities or p-type impurities.

When the semiconductor substrate 110 is of the p-type, the semiconductor substrate 110 may be doped with impurities of a group III element, such as boron (B), gallium (Ga), and indium (In). On the contrary, when the semiconductor substrate 110 is of the n-type, the semiconductor substrate 110 may be doped with impurities of a group V element, such as phosphorus (P), arsenic (As), and antimony (Sb).

A front surface of the semiconductor substrate 110 may be an uneven surface having a plurality of uneven portions or having uneven characteristics. Hence, an amount of light reflected from the front surface of the semiconductor substrate 110 may decrease, and an amount of light incident on the inside of the semiconductor substrate 110 may increase.

The tunnel layer 180 may be formed between an entire back surface of the semiconductor substrate 110 and front surface of the first and second conductive regions 121 and 172.

Thus, a front surface of the tunnel layer 180 may directly contact the entire back surface of the semiconductor substrate 110, and a back surface of the tunnel layer 180 may directly contact the front surface of the first and second conductive regions 121 and 172.

The tunnel layer 180 may be formed by depositing a dielectric material or a semiconductor material on the back surface of the semiconductor substrate 110.

More specifically, the tunnel layer 180 may be formed of the dielectric material such as silicon oxide (SiOx) or the semiconductor material such as amorphous silicon (a-Si) and silicon carbide (SiC).

It may be more preferable, but not required, that the tunnel layer 180 is formed of SiCx or SiOx having strong durability even in a high temperature process equal to or greater than 600° C.

Other materials may be used. For example, the tunnel layer 180 may be formed of silicon nitride (SiNx), hydrogenated SiNx, aluminum oxide (AlOx), silicon oxynitride (SiON), or hydrogenated SiON.

Carriers produced in the semiconductor substrate 110 may pass through the tunnel layer 180, and the tunnel layer 180 may perform a passivation function with respect to the back surface of the semiconductor substrate 110.

A thickness T180 of the tunnel layer 180 may be 1 nm to 3 nm, so as to properly perform the passivation function with respect to the semiconductor substrate 110 while causing carriers produced in the semiconductor substrate 110 to pass through the tunnel layer 180.

Even when a high temperature thermal process is used to manufacture the solar cell, the tunnel layer 180 may prevent or reduce characteristics (for example, carrier life time) of the semiconductor substrate 110 from being damaged.

Only when the first and second conductive regions 121 and 172 include polycrystalline silicon material obtained by recrystallizing amorphous silicon, the tunnel layer 180 may be formed.

However, when the first and second conductive regions 121 and 172 are formed by diffusing impurities into the semiconductor substrate 110 or are formed using amorphous silicon (a-Si) material or metal oxide, the tunnel layer 180 may be omitted.

When the first and second conductive regions 121 and 172 are formed of polycrystalline silicon material obtained by recrystallizing amorphous silicon, the same silicon material as the semiconductor substrate 110, or an amorphous silicon material, each of the first and second conductive regions 121 and 172 may be doped with impurities of the first conductive type or impurities of the second conductive type.

However, when the first and second conductive regions 121 and 172 are formed of a metal oxide, the first and second conductive regions 121 and 172 may form a p-n junction along with the semiconductor substrate 110 by Fermi level of the metal oxide. Therefore, when the first and second conductive regions 121 and 172 are formed of a metal oxide, each of the first and second conductive regions 121 and 172 may not be doped with impurities of the first conductive type or impurities of the second conductive type.

FIG. 3 illustrates that the first and second conductive regions 121 and 172 include polycrystalline silicon material obtained by recrystallizing amorphous silicon, as an example. Thus, the embodiment of the invention is described using the solar cell including the tunnel layer 180 as an example.

The first conductive region 121 is disposed at the back surface of the semiconductor substrate 110. For example, as shown in FIG. 3 and (a) of FIG. 4, the first conductive region 121 may directly contact a portion of the back surface of the tunnel layer 180. However, unlike FIG. 3 and (a) of FIG. 4, when there is no tunnel layer 180, the first conductive region 121 may directly contact a portion of back surface of the semiconductor substrate 110.

The first conductive region 121 may be doped with impurities of the first conductive type. Thus, if the semiconductor substrate 110 is doped with impurities of the first conductive type, the first conductive region 121 may serve as a back surface field region. On the contrary, if the semiconductor substrate 110 is doped with impurities of the second conductive type, the first conductive region 121 may form a p-n junction along with the semiconductor substrate 110 with the tunnel layer 180 interposed therebetween, thereby serving as an emitter region. Hereinafter, the embodiment of the invention is described using the emitter region as an example of the first conductive region 121.

For example, when the first conductive region 121 serves as the emitter region and the second conductive region 172 serves as the back surface field region, electron-hole pairs may be produced in the semiconductor substrate 110 by light incident from the outside. The electron-hole pairs may be separated into electrons and holes by a p-n junction between the first conductive region 121 and the semiconductor substrate 110. The separated holes may move to the plurality of first conductive regions 121, and the separated electrons may move to the plurality of second conductive regions 172.

On the contrary, when the first conductive region 121 is of the n-type, the separated electrons may move to the plurality of first conductive regions 121, and the separated holes may move to the plurality of second conductive regions 172.

The second conductive region 172 is disposed at the back surface of the semiconductor substrate 110. For example, as shown in FIG. 3 and (a) of FIG. 4, the second conductive region 172 may directly contact a remaining portion not contacting the first conductive region 121 except a portion of the back surface of the tunnel layer 180 contacting the first conductive region 121. However, unlike FIG. 3 and (a) of FIG. 4, when there is no tunnel layer 180, the first conductive region 121 may directly contact a portion of the back surface of the semiconductor substrate 110.

The second conductive region 172 may be doped with impurities of the second conductive type opposite the first conductive type and may have a conductive type opposite the first conductive region 121. Thus, when the first conductive type of the first conductive region 121 is the p-type, the second conductive type of the second conductive region 172 may be the n-type. An impurity doping concentration of the second conductive region 172 may be higher than an impurity doping concentration of the semiconductor substrate 110.

For example, when the semiconductor substrate 110 is doped with n-type impurities, the second conductive region 172 may serve as the back surface field region.

Thus, the second conductive region 172 can prevent or reduce electrons from moving to the second conductive region 172 by a potential barrier formed by a difference between the impurity doping concentrations of the semiconductor substrate 110 and the second conductive region 172 and can make it easier for holes to move to the second conductive region 172.

Further, the second conductive region 172 can reduce an amount of carriers lost by a recombination of electrons and holes and can increase an amount of holes moving to the second conductive region 172 by accelerating a movement of carriers.

The first and second conductive regions 121 and 172 may be formed using one of (1) a single crystal silicon material, (2) a polycrystalline silicon material, (3) an amorphous silicon material, or (4) a metal oxide.

As described above, when the first and second conductive regions 121 and 172 are formed of a single crystal silicon material, a polycrystalline silicon material, or an amorphous silicon material, the first and second conductive regions 121 and 172 may be doped with impurities of the first conductive type or impurities of the second conductive type and may have the opposite conductive types. However, when the first and second conductive regions 121 and 172 are formed of a metal oxide, the first and second conductive regions 121 and 172 may not be doped with impurities of the first and second conductive types and may have the opposite conductive types by Fermi level of the metal oxide.

For example, as shown in FIG. 3 and (a) of FIG. 4, when the first and second conductive regions 121 and 172 of the solar cell according to the embodiment of the invention are formed by doping the back surface of the tunnel layer 180 with polycrystalline silicon material, the tunnel layer 180 may be formed so that a thermal damage to the semiconductor substrate 110 is minimized in a thermal process for forming the first and second conductive regions 121 and 172 using the polycrystalline silicon material.

When the first and second conductive regions 121 and 172 are formed of polycrystalline silicon material, the first and second conductive regions 121 and 172 may be formed by depositing an intrinsic polycrystalline silicon layer on the back surface of the tunnel layer 180 and then injecting impurities of the second conductive type into the intrinsic polycrystalline silicon layer. Alternatively, the first and second conductive regions 121 and 172 may be formed by depositing an intrinsic amorphous silicon layer on the back surface of the tunnel layer 180, recrystallizing the intrinsic amorphous silicon layer into an intrinsic polycrystalline silicon layer through a thermal processing, and injecting impurities of the second conductive type into the recrystallized intrinsic polycrystalline silicon layer.

However, unlike FIG. 3 and (a) of FIG. 4, the first and second conductive regions 121 and 172 may be formed of the same single crystal silicon material or the same polycrystalline silicon material as the semiconductor substrate 110 by diffusing impurities into the semiconductor substrate 110, or may be formed by depositing an amorphous silicon material or a metal oxide on the back surface of the semiconductor substrate 110. In this instance, because the high temperature thermal process is omitted, the tunnel layer 180 may be omitted.

FIG. 3 and (a) of FIG. 4 illustrate that the first and second conductive regions 121 and 172 directly contact each other, as an example. However, the first and second conductive regions 121 and 172 may be separated from each other.

When the first and second conductive regions 121 and 172 are separated from each other, an intrinsic semiconductor layer, which is not doped with impurities of the first and second conductive types, or the insulating layer 190 may be formed in a separation space between the first and second conductive regions 121 and 172.

As shown in FIG. 3 and (a) of FIG. 4, the insulating layer 190 may be positioned between the first and second electrodes 141 and 142 and on a portion, which is not connected to the first and second electrodes 141 and 142 in the back surface of the first and second conductive regions 121 and 172.

The insulating layer 190 between the first and second electrodes 141 and 142 can prevent a short circuit between the first and second electrodes 141 and 142. Further, the insulating layer 190 on the back surface of the first and second conductive regions 121 and 172 can perform a passivation function to remove a defect resulting from a dangling bond at the back surface of the first and second conductive regions 121 and 172 and to prevent carriers produced in the semiconductor substrate 110 from being recombined and disappeared by the dangling bond.

The first electrode 141 may be connected to each first conductive region 121 and may collect carriers (for example, holes) moving to the corresponding first conductive region 121.

The second electrode 142 may be connected to each second conductive region 172 and may collect carriers (for example, electrons) moving to the corresponding second conductive region 172.

As shown in FIG. 3 and (a) of FIG. 4, the first and second electrodes 141 and 142 may respectively include first and second electrode layers 141L and 142L which have a surface shape of a two-layered structure.

More specifically, as shown in FIG. 3 and (a) of FIG. 4, the first electrode 141 may include the first electrode layer 141L which is formed on the first and second areas S1 and S2 of the back surface of the semiconductor substrate 110 in the surface shape and has an opening in a formation area of the second conductive region 172.

Further, the second electrode 142 may include the second electrode layer 142L which is connected to the second conductive region 172 through the opening of the first electrode layer 141L, is separated from the first electrode layer 141L while overlapping the first electrode layer 141L at the back surface of the semiconductor substrate 110, and is positioned on the second area S2 in the surface shape.

As described above, when the first and second electrodes 141 and 142 are configured as the two-layered structure of the first and second electrode layers 141L and 142L, a tabbing process for connecting the plurality of solar cells in series using the interconnector 300 may be further simplified, so as to minimize a resistance loss of the first and second electrodes 141 and 142 and modularize the plurality of solar cells.

More specifically, when each of the first and second electrodes 141 and 142 of the solar cell includes finger electrodes, which are separated from one another and extend in one direction in parallel with one another to thereby form a stripe shape, the solar cell has to include a bus bar connected to an end of the finger electrode for connecting the interconnector. In this instance, carriers collected through the first and second conductive regions move along the finger electrode and then move to the interconnector 300 through the bus bar. As described above, when the carrier move along the finger electrode, there is a loss resulting from a serial resistance.

Further, thicknesses of the finger electrode and the bus bar have to increase to 30 μm or more, so as to minimize a loss resulting from a surface resistance. Moreover, as an area of the semiconductor substrate 110 increases, a component of the surface resistance further increases. Hence, the thicknesses of the finger electrode and the thicknesses of the bus bar have to further increase to two or three times previous thicknesses.

However, as in the embodiment of the invention, when the first and second electrodes 141 and 142 are configured as the two-layered structure of the first and second electrode layers 141L and 142L, a horizontal movement distance of carriers can be minimized. Hence, a loss resulting from a surface resistance can be minimized, and thicknesses of the first and second electrodes 141 and 142 do not have to increase so as to secure the surface resistance. As a result, the manufacturing cost of the first and second electrodes 141 and 142 can be minimized.

Further, in the embodiment of the invention, when the interconnector 300 is connected to the first and second electrodes 141 and 142 in the tabbing process for connecting the plurality of solar cells in series, the accurate alignment is not required. Therefore, the tabbing process may be further simplified. Hence, the manufacturing cost can be further reduced, and process yield may be further improved.

Hereinafter, a pattern of the first and second conductive regions 121 and 172, a pattern of first and second transparent electrode layers 141C and 142C, a pattern of the insulating layer 190, and a pattern of the first and second electrode layers 141L and 142L exposed to the back surface of the semiconductor substrate 110 when viewed from the back surface of the semiconductor substrate 110 are described, so as to describe the solar cell shown in FIG. 3 and (a) of FIG. 4 in detail.

Figure 5:
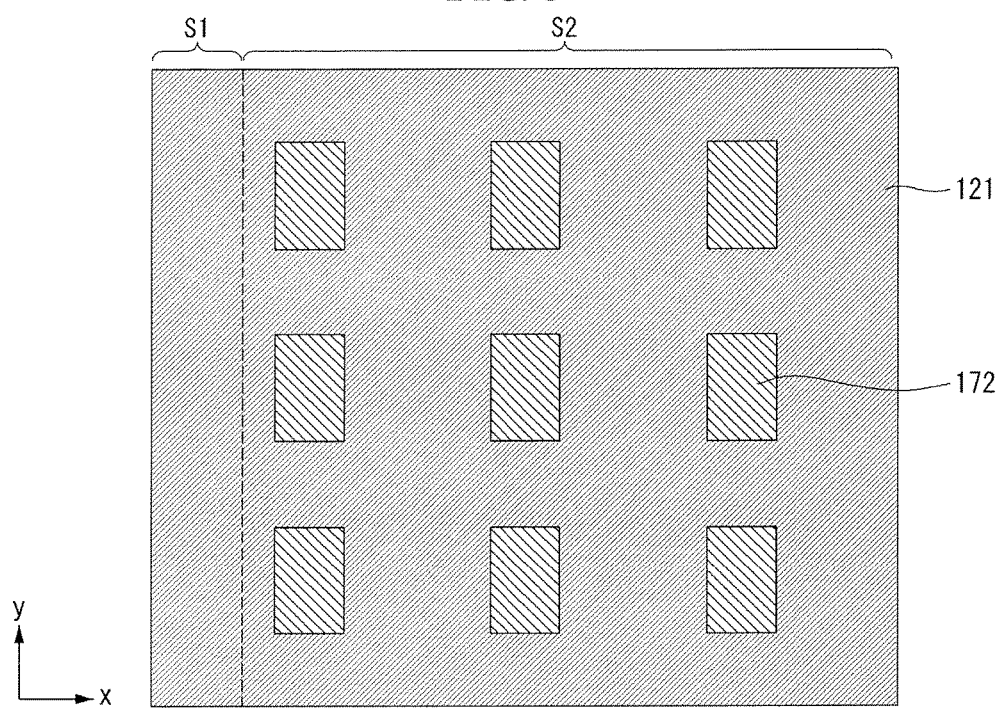

FIG. 5 is a cross-sectional view taken along LV1-LV1 in the solar cell shown in (a) of FIG. 4, so as to illustrate an example of a plane pattern of the first and second conductive regions 121 and 172 in the solar cell shown in FIGS. 3 and 4.

As shown in FIGS. 3 to 5, the first conductive region 121 according to the embodiment of the invention may be entirely formed in the first and second areas S1 and S2 of the back surface of the semiconductor substrate 110 and may have a plurality of openings in the second area S2. The second conductive region 172 according to the embodiment of the invention may be formed in the second area S2 of the back surface of the semiconductor substrate 110 and may be formed inside the plurality of openings of the first conductive region 121.

In this instance, the plurality of second conductive regions 172 in the second area S2 may be separated from one another and may have a lattice arrangement.

As shown in FIG. 5, each of the plurality of second conductive regions 172 may have a rectangular shape. Other shapes may be used. For example, the second conductive region 172 may have a dot shape, a polygon shape, a circular shape, and an oval shape.

In this instance, the number of second conductive regions 172 or a distance between the second conductive regions 172 may be optimized depending on a short circuit current and a fill factor.

The first and second conductive regions 121 and 172 may have the same thickness. The thickness of the first and second conductive regions 121 and 172 may be 5 nm to 100 nm, so as to minimize manufacturing time while sufficiently performing a function of the emitter region or a function of the back surface field region.

FIGS. 3 to 5 illustrate that the first and second conductive regions 121 and 172 directly contact each other, as an example. Unlike this, the first and second conductive regions 121 and 172 may be separated from each other so as to minimize a leakage current, and an intrinsic semiconductor layer, which is not doped with impurities of the first and second conductive types, or the insulating layer 190 may be formed in a separation portion between the first and second conductive regions 121 and 172.

Figure 6:
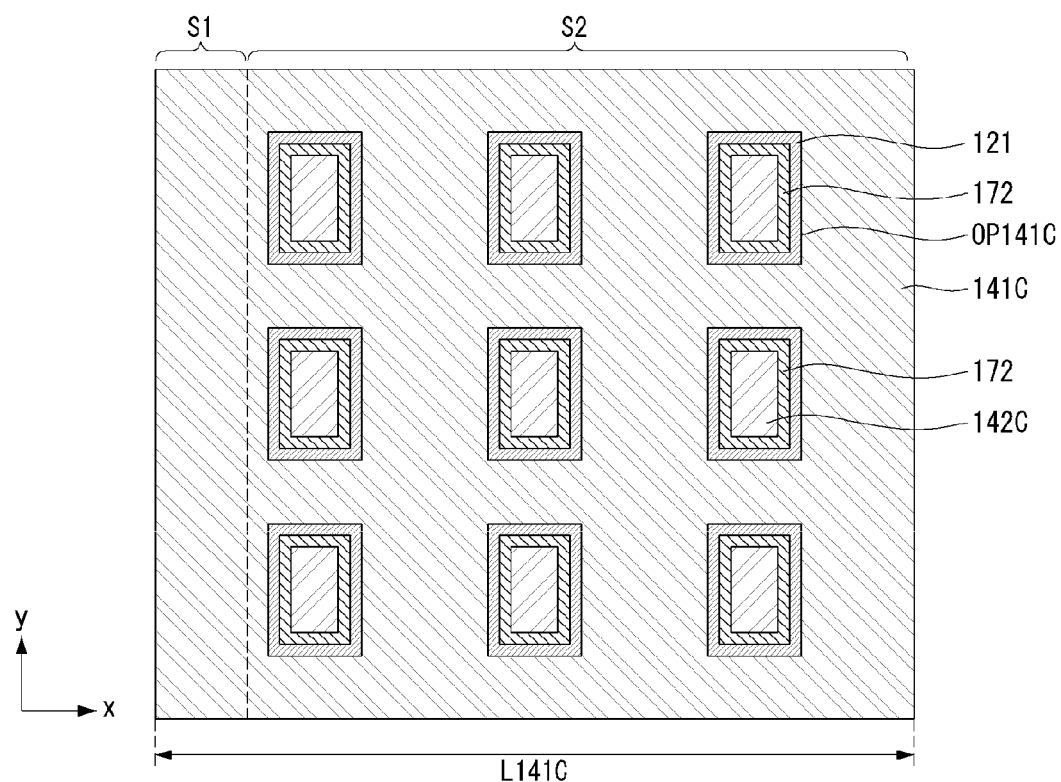

FIG. 6 is a cross-sectional view taken along LV2-LV2 in the solar cell shown in (a) of FIG. 4, so as to illustrate an example of a pattern of the first and second transparent electrode layers 141C and 142C in the solar cell shown in FIGS. 3 and 4.

The insulating layer 190 was omitted in FIG. 6 for the sake of brevity and ease of reading.

Referring to FIG. 3, (a) of FIG. 4, and FIG. 6, the first electrode 141 may further include the first transparent electrode layer 141C positioned between the first electrode layer 141L and the first conductive region 121.

The first transparent electrode layer 141C may be entirely formed on the first and second areas S1 and S2 of the back surface of the semiconductor substrate 110 in the surface shape and may have a plurality of openings OP141C in an area, in which the second conductive region 172 is formed.

A length L141C of the first transparent electrode layer 141C in the first direction x may be substantially equal to a length of the semiconductor substrate 110 or a length of the first conductive region 121 in the first direction x.

The first transparent electrode layer 141C may be directly connected to the first conductive region 121 shown in FIG. 5.

Further, the second electrode 142 may further include the second transparent electrode layer 142C positioned between the second electrode layer 142L and the second conductive region 172, and the second transparent electrode layer 142C may be positioned in a formation area of the openings OP141C of the first transparent electrode layer 141C.

The second transparent electrode layer 142C may function to connect the second electrode layer 142L to the second conductive region 172 through the first electrode layer 141L or the openings OP141C of the first transparent electrode layer 141C.

The second transparent electrode layer 142C may be formed to be narrower than the second conductive region 172 and may be separated from the first transparent electrode layer 141C.

The first transparent electrode layer 141C and the second transparent electrode layer 142C may be simultaneously formed through the same process and may have the same thickness.

In FIG. 6, the insulating layer 190 may be formed in a separation space between the first transparent electrode layer 141C and the second transparent electrode layer 142C as shown in FIGS. 3 and 4. Hence, the insulating layer 190 may insulate the first transparent electrode layer 141C from the second transparent electrode layer 142C so that they are not short-circuited.

The first and second transparent electrode layers 141C and 142C may be formed of transparent conductive oxide. For example, the first and second transparent electrode layers 141C and 142C may be formed of at least one of indium tin oxide (ITO), indium zinc oxide (IZO), zinc oxide (ZnO), indium tungsten oxide (IWO), or hydrogen-doped indium oxide (IO:H).

When the first and second transparent electrode layers 141C and 142C are formed of transparent conductive oxide and are respectively connected to the first and second conductive regions 121 and 172, (1) contact resistances between the first and second transparent electrode layers 141C and 142C and the first and second conductive regions 121 and 172 can be reduced. Further, (2) the first and second transparent electrode layers 141C and 142C can prevent a plasma damage, an increase in recombination of carriers, and the diffusion of ions of the metal material included in the first and second electrode layers 141L and 142L, which may be generated when the metal material included in the first and second electrode layers 141L and 142L is formed on the first and second conductive regions 121 and 172, since a metal material, for example, copper (Cu) or aluminum (Al) included in the first and second electrode layers 141L and 142L is not directly connected to the first and second conductive regions 121 and 172 through the first and second transparent electrode layers 141C and 142C.

In particular, when the first and second conductive regions 121 and 172 are formed of amorphous silicon or metal oxide, the first and second transparent electrode layers 141C and 142C including transparent conductive oxide can further improve the efficiency of the solar cell due to the above-described effect.

However, when the first and second conductive regions 121 and 172 are formed using the same material as the semiconductor substrate 110 or using polycrystalline silicon material, the formation of the first and second transparent electrode layers 141C and 142C generate little effect. Therefore, the first and second transparent electrode layers 141C and 142C may be omitted.

Thicknesses T141C and T142C of the first and second transparent electrode layers 141C and 142C may be 10 nm to 100 nm so as to secure the low resistance and prevent the plasma damage and the diffusion of ions. Or, the first and second transparent electrode layers 141C and 142C may have the same thickness.

FIG. 7 is a cross-sectional view taken along LV3-LV3 in the solar cell shown in (a) of FIG. 4, so as to illustrate an example of a pattern of the first electrode layer 141L and a second auxiliary electrode 142L' in the solar cell shown in FIGS. 3 and 4.

Referring to FIG. 3, (a) of FIG. 4, and FIG. 7, the first electrode layer 141L may be formed on the first transparent electrode layer 141C, and the first electrode layer 141L may be formed on nearly the entire area of the back surface of the semiconductor substrate 110 in the surface shape and may include an opening OP141L in a formation area of the second conductive region 172.

The first electrode layer 141L may be directly connected to the first transparent electrode layer 141C.

Referring to (b) of FIG. 4, the first electrode layer 141L may include a first base layer 141La, a first buffer layer 141Lb, and a first solder metal layer 141Lc.

The first base layer 141La may be formed using at least one of aluminum (Al) and copper (Cu) with very good conductivity. The first buffer layer 141Lb may be formed at a boundary between the first base layer 141La and the first transparent electrode layer 141C and may be formed of at least one of titanium (Ti), chromium (Cr), and molybdenum (Mo). The first solder metal layer 141Lc may be formed on a back surface of the first base layer 141La and may be formed using a metal material capable of performing soldering, for example, tin (Sn) so as to easily perform a connection of the interconnector 300.

A pattern of the first electrode layer 141L shown in FIG. 7 and a pattern of the first transparent electrode layer 141C shown in FIG. 6 may be substantially the same as each other when viewed from the back surface of the semiconductor substrate 110.

Thus, when viewed from the back surface of the semiconductor substrate 110, the pattern of the first electrode layer 141L may be formed on the entire back surface of the semiconductor substrate 110 in the surface shape and may include the opening OP141L in the formation area of the second conductive region 172.

A size and a location of the opening OP141L of the first electrode layer 141L may be substantially the same as those of the opening OP141C of the first transparent electrode layer 141C.

Further, as shown in FIG. 3, (a) of FIG. 4, and FIG. 7, the second auxiliary electrode 142L' may be positioned on the second transparent electrode layer 142C positioned inside the opening OP141L of the first electrode layer 141L and may be directly connected to the second transparent electrode layer 142C.

As shown in (c) of FIG. 4, the second auxiliary electrode 142L' may include a second auxiliary base layer 142L'a and a second auxiliary buffer layer 142L'b.

The second auxiliary base layer 142L'a may be formed using at least one of aluminum (Al) and copper (Cu) with very good conductivity. The second auxiliary buffer layer 142L'b may be formed at a boundary between the second auxiliary base layer 142L'a and the second transparent electrode layer 142C and may be formed of at least one of titanium (Ti), chromium (Cr), and molybdenum (Mo).

Figure 8:
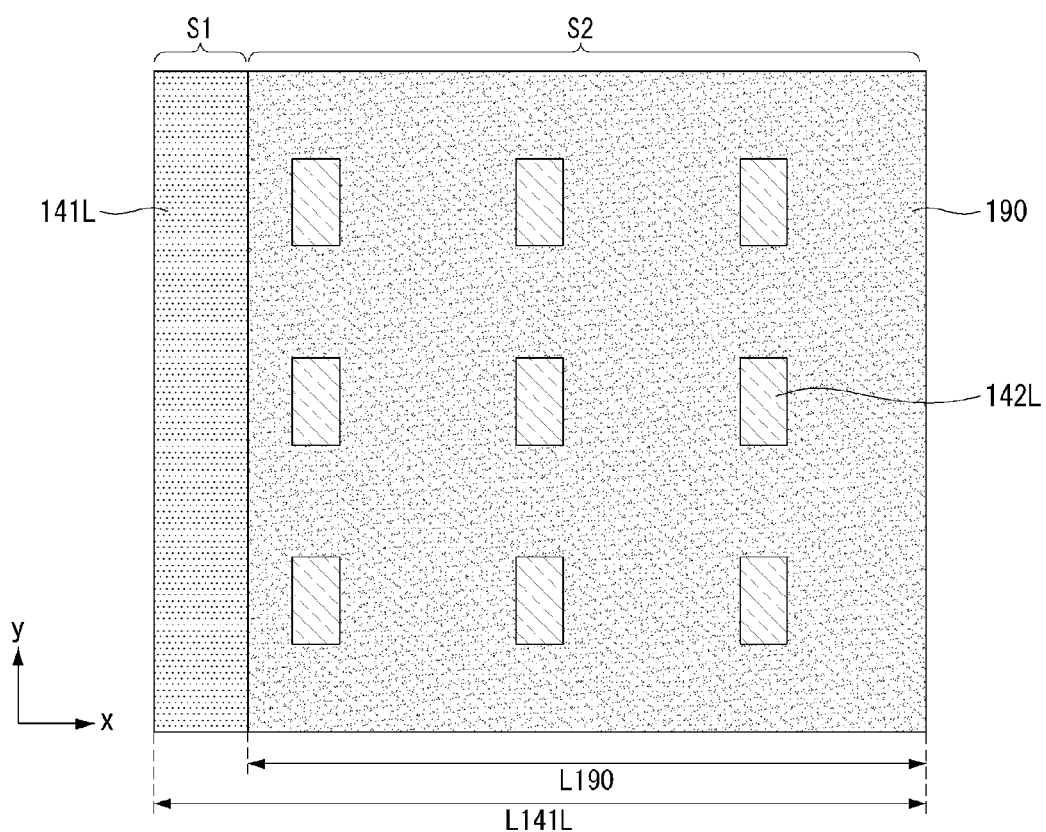

FIG. 8 is a cross-sectional view taken along LV4-LV4 in the solar cell shown in (a) of FIG. 4, so as to illustrate an example of a pattern of the insulating layer 190 in the solar cell shown in FIG. 3 and (a) of FIG. 4.

In a state where the first electrode layer 141L is positioned on the first transparent electrode layer 141C and the second auxiliary electrode 142L' is positioned on the second transparent electrode layer 142C as described above with reference to FIG. 7, as shown in FIG. 8, the insulating layer 190 may be further formed on the first electrode layer 141L of the second area S2 and may have a plurality of openings to expose the second electrode layer 142L, therefore, the insulating layer 190 may be configured so that a portion of the first electrode layer 141L serving as a first electrode pad is exposed in the first area S1 of the semiconductor substrate 110, and a portion of the second electrode layer 142L connected to the second auxiliary electrode 142L' is exposed in the second area S2 of the semiconductor substrate 110.

Afterwards, the second electrode layer 142L is formed on the insulating layer 190. Hence, as shown in FIGS. 3 and 4, the insulating layer 190 may be positioned in a vertically separated space between the first electrode layer 141L and the second electrode layer 142L.

As shown in FIG. 8, the insulating layer 190 may include a plurality of openings OP190, and the second electrode layer 142L may be connected to the second transparent electrode layer 142C through the plurality of openings OP190.

A thickness T190 of the insulating layer 190 may be greater than a thickness of the tunnel layer 180 and may be, for example, 50 nm to 200 nm, so as to prevent a short circuit between the first and second electrodes 141 and 142.

The insulating layer 190 may be formed of a dielectric material. For example, the insulating layer 190 may be formed of at least one of an amorphous silicon oxide (a-SiOx), an amorphous silicon nitride (a-SiNx), an amorphous silicon carbide (a-SiCx), or an aluminum oxide (AlOx). In addition, the insulating layer 190 may be formed of at least one of a hydrogenated silicon nitride (SiNx:H), a hydrogenated silicon oxide (SiOx:H), a hydrogenated silicon nitride oxide (SiNxOy:H), a hydrogenated silicon oxynitride (SiOxNy:H), and a hydrogenated amorphous silicon (a-Si:H).

The insulating layer 190 may be configured to completely cover one side of the semiconductor substrate 110 parallel to the second direction y and expose the other side of the semiconductor substrate 110 parallel to the second direction y by a width of the first area S1, so as to expose a portion of the first electrode layer 141L positioned on the first area S1 of the back surface of the semiconductor substrate 110.

Hence, a length L190 of the insulating layer 190 in the first direction x may be less than a length L141L of the first electrode layer 141L in the first direction x.

Further, a portion of the first electrode layer 141L serving as the first electrode pad may be exposed to the first area S1, so that the first electrode layer 141L is connected to the interconnector 300.

Figure 9:
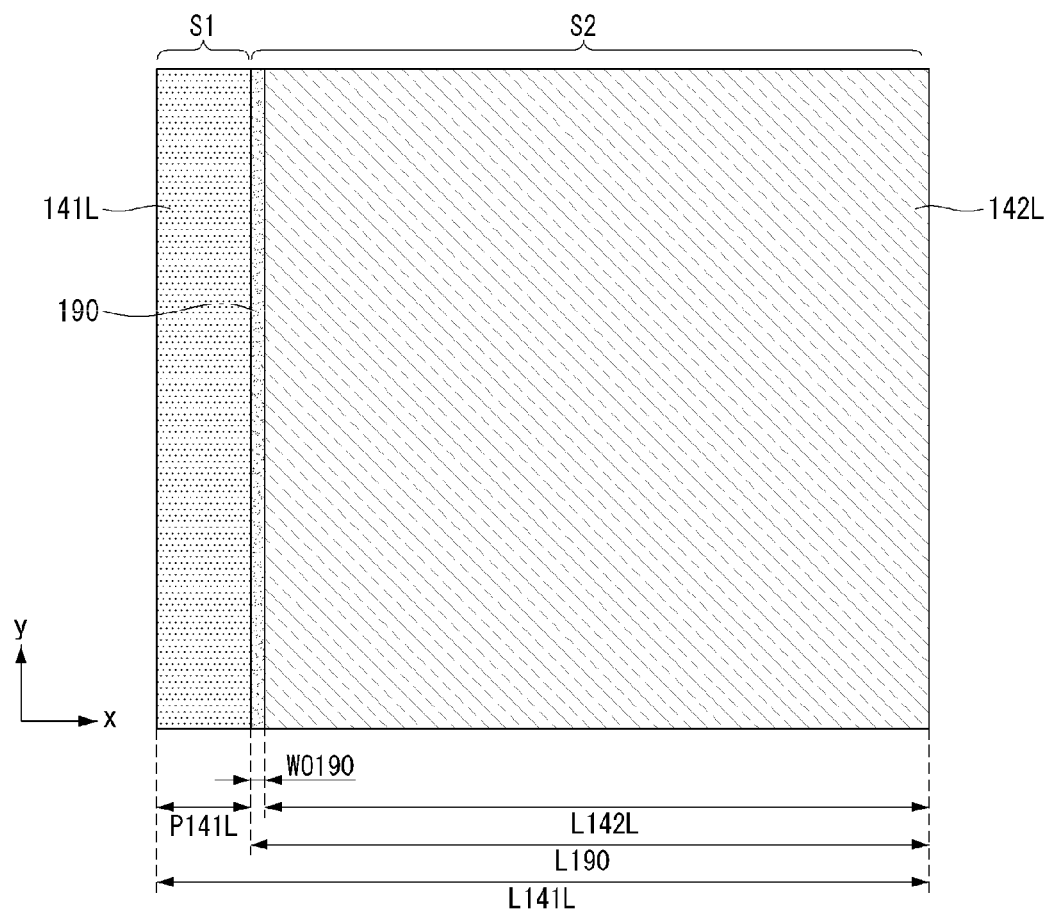

FIG. 9 illustrates an example of a pattern of the first and second electrode layers 141L and 142L exposed to the back surface of the semiconductor substrate 110 in the solar cell shown in FIG. 3 and (a) of FIG. 4.

Referring to FIG. 3, (a) of FIG. 4, and FIG. 9, the second electrode layer 142L may be connected to the second transparent electrode layer 142C positioned inside the opening OP141L of the first electrode layer 141L and may be separated from the first electrode layer 141L in the thickness direction z in the surface shape while overlapping the first electrode layer 141L in the second area S2 of the back surface of the semiconductor substrate 110.

The second electrode layer 142L may be connected to the second auxiliary electrode 142L' and may be entirely formed on the second area S2.

Hence, a length L142L of the second electrode layer 142L in the first direction x may be less than the length L141L of the first electrode layer 141L in the first direction x.

Further, a length P141L of the first electrode layer 141L exposed to the first area S1 in the first direction x may be less than the length L142L of the second electrode layer 142L exposed to the second area S2 in the first direction x.

The second electrode layer 142L may be configured such that a portion of the insulating layer 190 is exposed to an end of the second area S2 contacting the first area S1 so as to certainly secure a short circuit between the first and second electrode layers 141L and 142L.

Hence, the length L142L of the second electrode layer 142L in the first direction x may be less than a length L190 of the insulating layer 190 in the first direction x. A width WO190 of a portion of the insulating layer 190 exposed between the first and second areas S1 and S2 may be less than the length P141L of the first electrode layer 141L exposed to the first area S1 in the first direction x.

(a) of FIG. 4 and FIG. 9 illustrate that the insulating layer 190 protrudes further than the second electrode layer 142L toward the first area S1, as an example. Other configurations may be used. For example, (1) an end of the insulating layer 190 adjacent to the first area S1 may be positioned at the same location as an end of the second electrode layer 142L adjacent to the first area S1 or (2) the end of the insulating layer 190 may be undercut more inwardly than the end of the second electrode layer 142L, so that the end of the second electrode layer 142L protrudes further than the end of the insulating layer 190 as long as the second electrode layer 142L is not short-circuited to the first electrode layer 141L.

The second electrode layer 142L may be formed using at least one of Al and Cu with very good conductivity. In addition, the second electrode layer 142L may be formed using a metal material capable of performing soldering, for example, tin (Sn).

More specifically, as shown in (d) of FIG. 4, the second electrode layer 142L may include a second base layer 142La and a second solder metal layer 142Lc.

The second base layer 142La may be electrically connected to the second auxiliary base layer 142L'a inside the opening of the insulating layer 190 and may be entirely formed on the insulating layer 190.

The second base layer 142La may be formed using at least one of Al and Cu with very good conductivity. The second solder metal layer 142Lc may be formed on the second base layer 142La and may be formed using a metal material capable of performing soldering, for example, tin (Sn) so as to easily perform a connection of the interconnector 300.

The first and second electrode layers 141L and 142L may be formed using, for example, a sputtering method.

A thickness T141L of the first electrode layer 141L may be greater than a thickness T141C of the first transparent electrode layer 141C and may be, for example, 100 nm to 5 μm.

A thickness T142L of the second electrode layer 142L may be greater than a thickness T142C of the second transparent electrode layer 142C and may be, for example, 100 nm to 5 μm.

On the contrary, the first electrode layer 141L may be formed using the sputtering method, and the second electrode layer 142L may be formed using a screen printing method so as to form a predetermined pattern. In this instance, a thickness of the second electrode layer 142L may be greater than a thickness of the first electrode layer 141L. This is described later.

As described above, the solar cell according to the embodiment of the invention may form the first and second electrodes 141 and 142 in the two-layered structure of the first and second electrode layers 141L and 142L, thereby minimizing a loss of the surface resistance of the first and second electrodes 141 and 142 and securing the wide surface of the first and second electrodes 141 and 142 connected to the interconnector 300 through the first and second electrodes 141 and 142. Hence, the embodiment of the invention can easily perform the connection of the interconnector 300 and can simplify the process for modularizing the solar cell.

So far, the first embodiment of the invention described that the solar cell includes the first and second electrode layers 141L and 142L, and the interconnector 300 includes the plurality of first direction conductors 300x, as an example. However, the shape of the interconnector 300 according to the first embodiment of the invention may be changed, unlike FIGS. 1 and 2.

Modified examples of the solar cell module according to the first embodiment of the invention are described below.

Figure 10:
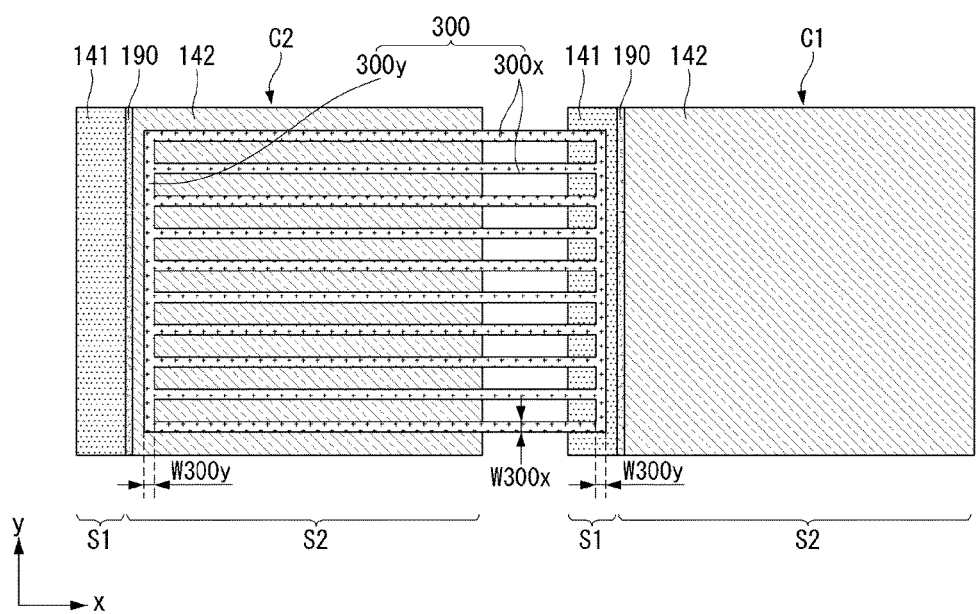
FIG. 10 illustrates a first modified example of a solar cell module according to a first embodiment of the invention.

FIG. 10 illustrates a first modified example of the solar cell module according to the first embodiment of the invention.

In FIG. 10, structures and components identical or equivalent to those illustrated in FIGS. 1 to 9 are designated with the same reference numerals, and a further description may be briefly made or may be entirely omitted.

As shown in FIG. 10, in the first modified example of the solar cell module according to the first embodiment of the invention, an interconnector 300 may include a second direction conductor 300y in addition to a plurality of first direction conductors 300x.

As shown in FIG. 10, the second direction conductor 300y may be formed at both ends of the first direction conductor 300x and may extend in the second direction y. The first and second direction conductors 300x and 300y may be formed as one body.

The second direction conductor 300y may increase a connection area of the interconnector 300 with respect to a first electrode layer 141L elongatedly exposed to a first area S1 of a first solar cell C1 in the second direction y and may further improve a physical adhesive strength.

Further, the second direction conductor 300y may increase a connection area of the interconnector 300, in the second direction y, connected to a second electrode layer 142L exposed to a second area S2 of a second solar cell C2 in the second direction y and may further improve a physical adhesive strength of the interconnector 300 with respect to the second electrode layer 142L.

Because the interconnector 300 includes the first direction conductors 300x as shown in FIGS. 1 and 2, a thermal expansion stress resulting from the interconnector 300 in a tabbing process may be minimized.

The two second direction conductors 300y respectively connected to both ends of the first direction conductor 300x may have the same width W300y. The width W300y of the second direction conductor 300y may be equal to or greater than a width W300x of the first direction conductor 300x, so as to further improve a contact strength of the interconnector 300 with respect to the first and second solar cells C1 and C2 while minimizing the thermal expansion stress in the first direction x.

So far, the embodiment of the invention described that the interconnector 300 includes the plurality of first direction conductors 300x, as an example. Unlike this, one first direction conductor 300x may be formed.

Figure 11:
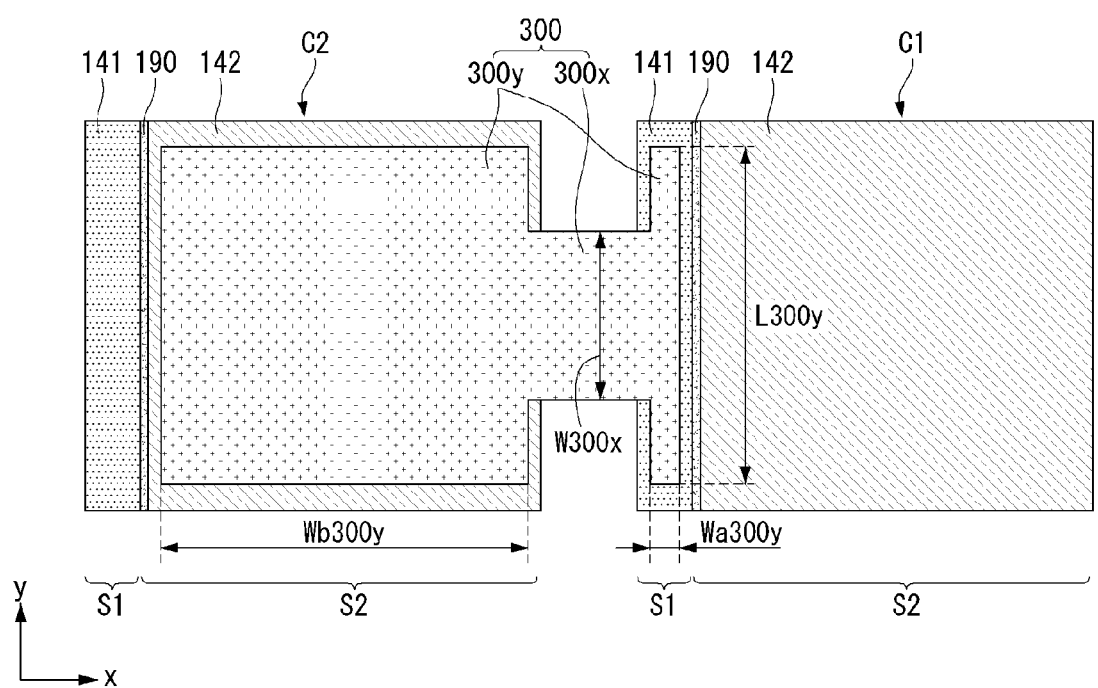
FIG. 11 illustrates a second modified example of a solar cell module according to a first embodiment of the invention.

Next, FIG. 11 illustrates a second modified example of the solar cell module according to the first embodiment of the invention.

As shown in FIG. 11, an interconnector 300 may include one first direction conductor 300x.

Namely, unlike FIGS. 1 to 10, the interconnector 300 shown in FIG. 11 may include one first direction conductor 300x. A width W300x of one first direction conductor 300x may be greater than a width Wa300y of a second direction conductor 300y connected to a first electrode layer 141L of a first solar cell C1 and may be less than a length L300y of the second direction conductor 300y.

A thermal expansion stress resulting from the interconnector 300 can be reduced by decreasing the width W300x of one first direction conductor 300x.

As shown in FIG. 11, a width of one of the two second direction conductors 300y respectively connected to both ends of the first direction conductor 300x may be different from a width of the other second direction conductor 300y. Namely, as shown in FIG. 11, the width Wa300y of the second direction conductor 300y connected to the first electrode layer 141L of the first solar cell C1 may be less than a width Wb300y of the second direction conductor 300y connected to a second electrode layer 142L of a second solar cell C2.

Figure 12:
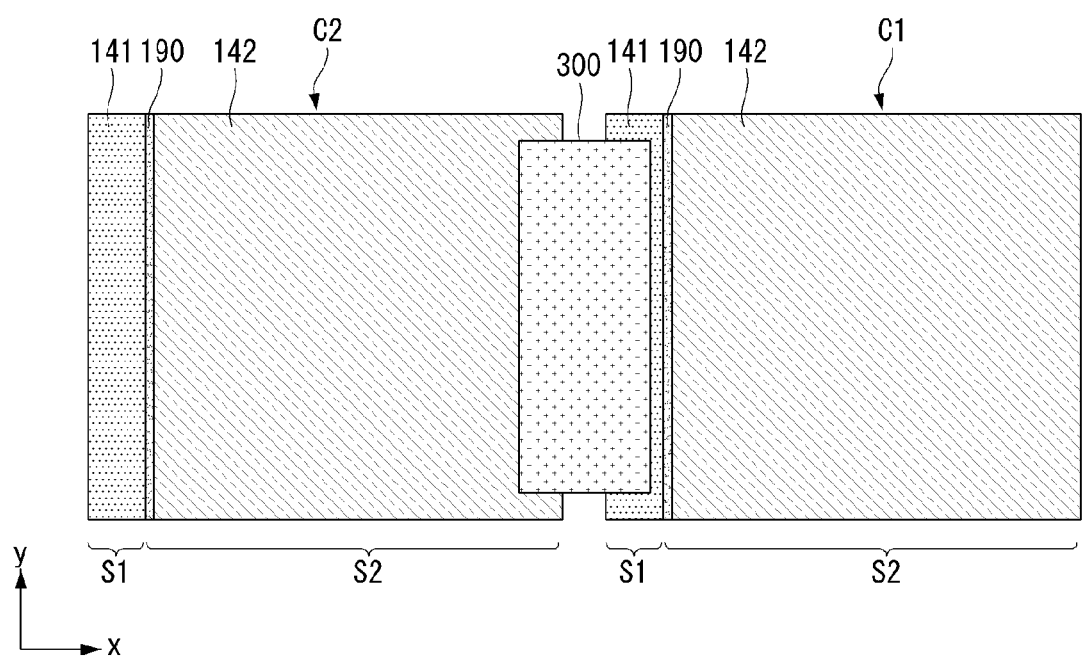
FIG. 12 illustrates a third modified example of a solar cell module according to a first embodiment of the invention.

Next, FIG. 12 illustrates a third modified example of the solar cell module according to the first embodiment of the invention.

As shown in FIG. 12, an interconnector 300 connected to solar cells including first and second electrode layers 141L and 142L of a surface shape may use a clip type interconnector extending in the second direction y.

When the above-described interconnector 300 extending in the second direction y is used, a manufacturing process of the solar cell module may be more easily performed.

So far, the first embodiment of the invention described that each of the first and second solar cells C1 and C2 includes both the first and second electrode layers 141L and 142L, as an example. However, in each of the first and second solar cells C1 and C2, the second electrode layer 142L may be omitted or patterned. In this instance, because the pattern of the second electrode 142 exposed to the second area S2 of the semiconductor substrate 110 is changed in each of the first and second solar cells C1 and C2, the shape of the interconnector 300 may be changed, unlike the first embodiment of the invention.

Figure 13:
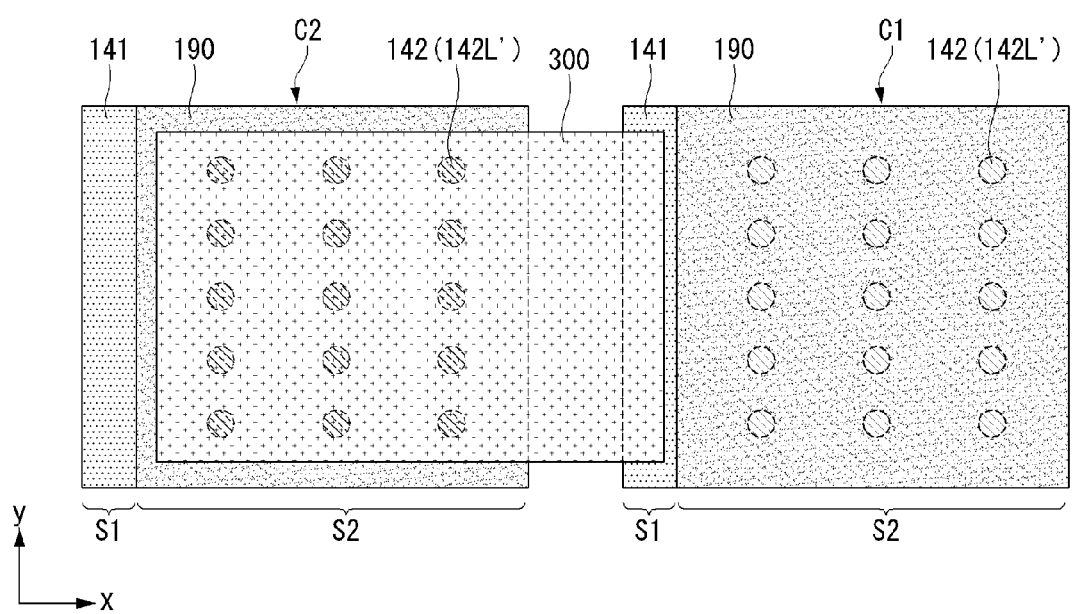
FIGS. 13 to 17 illustrate a solar cell module according to a second embodiment of the invention and a modified example thereof.
Figure 14:
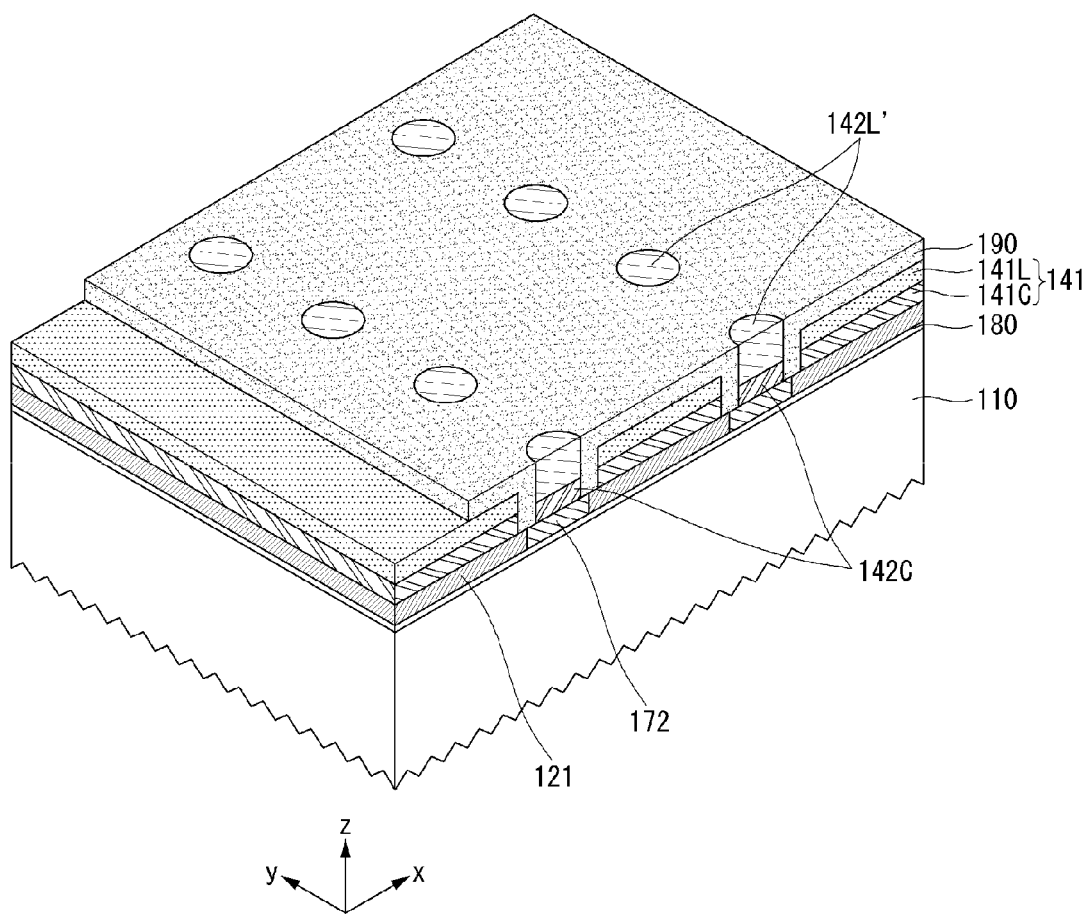
Figure 15:
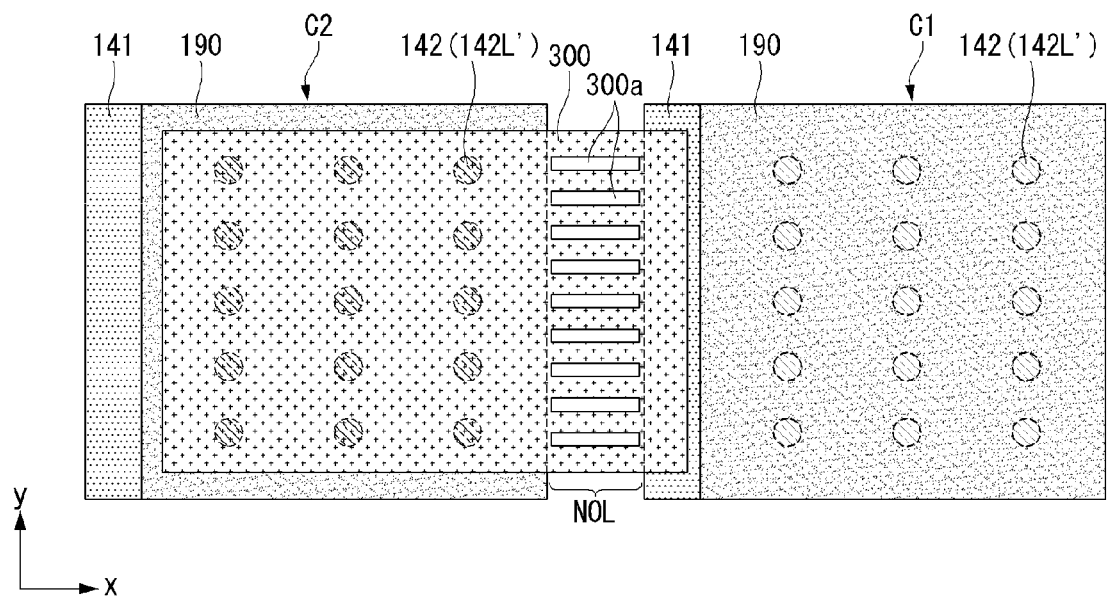
Figure 16:
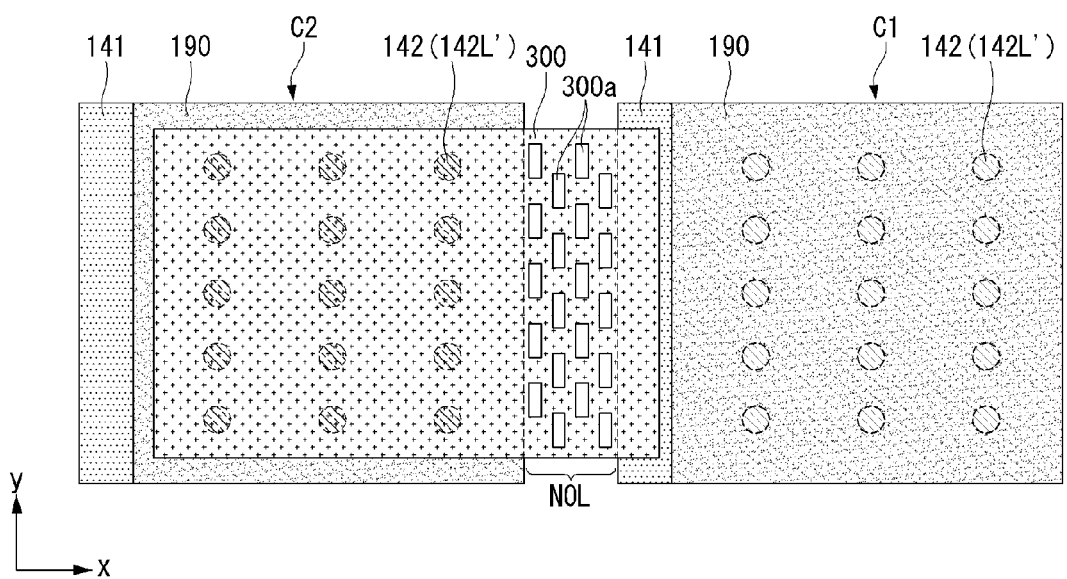
Figure 17:
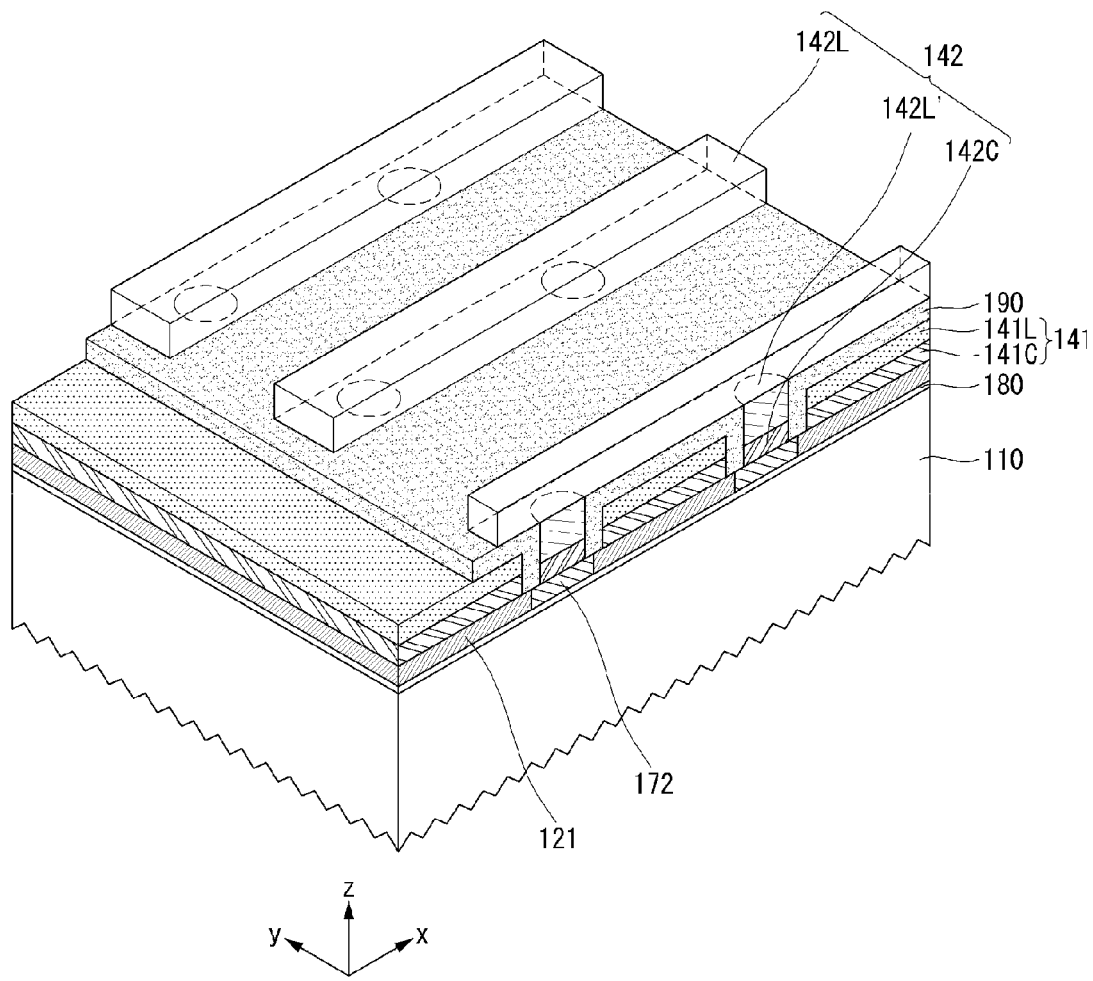

FIGS. 13 to 17 illustrate a solar cell module according to a second embodiment of the invention and a modified example thereof. More specifically, FIG. 13 illustrates the solar cell module according to the second embodiment of the invention when viewed from a back surface. FIG. 14 is a partial perspective view of a solar cell applied to the solar cell module according to the second embodiment of the invention. FIGS. 15 to 17 illustrate modified examples of the solar cell module according to the second embodiment of the invention.

In FIGS. 13 to 17, structures and components identical or equivalent to those illustrated in FIGS. 1 to 11 are designated with the same reference numerals, and a further description may be briefly made or may be entirely omitted.

More specifically, in a solar cell included in the solar cell module shown in FIGS. 13 to 17, since a semiconductor substrate 110, first and second conductive regions 121 and 172, first and second transparent electrode layers 141C and 142C, a first electrode layer 141L, and a second auxiliary electrode 142L' are substantially the same as those shown in FIGS. 3 to 9, a further description may be briefly made or may be entirely omitted.

As shown in FIG. 13, in the solar cell module according to the second embodiment of the invention, a first electrode 141 of each of first and second solar cells C1 and C2 may be exposed to a first area S1 of a back surface of the semiconductor substrate 110, and a second electrode 142 may be exposed to a remaining area, i.e., a second area S2 excluding the first area S1 from the back surface of the semiconductor substrate 110 in the same manner as the first embodiment of the invention. Further, the first area S1 may extend at an edge of the back surface of the semiconductor substrate 110 in a second direction y crossing a first direction x.

However, as shown in FIG. 14, unlike the first embodiment of the invention shown in FIG. 3, in the second embodiment of the invention, the first electrode 141 includes the first electrode layer 141L, but the second electrode 142 does not include a second electrode layer 142L. Namely, the second electrode 142 may include a second transparent electrode layer 142C and a second auxiliary electrode 142L'.

Thus, as shown in FIG. 13, only the second auxiliary electrode 142L' of the second electrode 142 may be exposed to the second area S2 of the semiconductor substrate 110.

An end of the second auxiliary electrode 142L' exposed to the second area S2 of the semiconductor substrate 110 through an opening of an insulating layer 190 may protrude further than a surface of the insulating layer 190. The end of the second auxiliary electrode 142L' may include a Sn-containing material so as to more easily perform a connection between an interconnector 300 and the second auxiliary electrode 142L'.

As shown in FIGS. 13 and 14, the second electrode 142 may include the plurality of second auxiliary electrodes 142L', and the plurality of second auxiliary electrodes 142L' may be separated from one another on the second area S2 of the semiconductor substrate 110 to form a lattice arrangement.

As shown in FIG. 14, the second auxiliary electrode 142L' may be connected to the second conductive region 172 through an opening of the first electrode layer 141L.

The insulating layer 190 may be positioned in a portion of the second area S2, to which the second auxiliary electrodes 142L' is exposed.

The interconnector 300 may have a surface shape. One end of the interconnector 300 may be connected to the first electrode layer 141L while overlapping the first electrode layer 141L exposed to the first area S1 of one of the first and second solar cells C1 and C2. The other end of the interconnector 300 may be connected to the plurality of second auxiliary electrodes 142L' while overlapping the plurality of second auxiliary electrodes 142L' exposed to the second area S2 of the other solar cell.

Because the interconnector 300 shown in FIG. 13 has a rectangular surface shape, a thermal expansion stress may relatively increase in a tabbing process for connecting the interconnector 300 to each solar cell.

Thus, as shown in FIGS. 15 and 16, a plurality of openings 300a may be formed in an area NOL of the interconnector 300 of the surface shape, which does not overlap the first and second solar cells C1 and C2, so as to reduce the thermal expansion stress resulting from the interconnector 300.

As shown in FIG. 15, for example, the plurality of openings 300a included in the interconnector 300 of the surface shape may be separated from one another in the second direction y and may extend in the first direction x. Alternatively, as shown in FIG. 16, the plurality of openings 300a may extend along the second direction y and may be separated from one another in the second direction y.

FIGS. 13 to 16 illustrate that the first electrode 141 includes the first electrode layer 141L, but the second electrode 142 does not include the second electrode layer 142L and includes the second transparent electrode layer 142C and the second auxiliary electrode 142L', as an example. Unlike FIGS. 13 to 16, in a modified example of the solar cell module according to the second embodiment of the invention shown in FIG. 17, the second electrode layer 142L is not omitted, is connected to the second auxiliary electrode 142L', and is patterned on the insulating layer 190.

Namely, as shown in FIG. 17, the second electrode layer 142L may overlap the second auxiliary electrode 142L' exposed through the opening of the insulating layer 190 and may extend in the first direction x.

The second electrode layer 142L patterned on the insulating layer 190 may be formed though a screen printing method, so as to easily perform the manufacturing process.

Thus, a thickness T142L of the second electrode layer 142L may be greater than a thickness of the first electrode layer 141L formed though a sputtering method and may be, for example, 5 µm to 100 µm.

As shown in FIG. 17, even when the second electrode layer 142L overlaps the second auxiliary electrode 142L' and extends on the insulating layer 190 in the first direction x, the interconnector 300 applied to the above-described first and second embodiments and the modified examples thereof may be applied to FIG. 17.

So far, the first and second embodiments of the invention and the modified examples thereof described that the first conductive region 121, the first transparent electrode layer 141C, and the first electrode layer 141L each have the plurality of openings and are formed on the entire back surface (including the first and second areas S1 and S2) of the semiconductor substrate 110; the second conductive region 172, the second transparent electrode layer 142C, and the second auxiliary electrode 142L' in the second area S2 of the semiconductor substrate 110 are formed inside the openings of the first conductive region 121, the first transparent electrode layer 141C, and the first electrode layer 141L; and the second electrode layer 142L is connected to the second auxiliary electrode 142L' and is entirely patterned on the insulating layer 190 positioned in the second area S2 of the semiconductor substrate 110, as an example.

Other patterns may be used for the first and second conductive regions 121 and 172, the first and second transparent electrode layers 141C and 142C, the insulating layer 190, and the first and second electrode layers 141L and 142L. Examples of the other patterns are described below.

FIGS. 18 to 23 illustrate an example of a solar cell applicable to a solar cell module according to an example embodiment of the invention.

Figure 18:
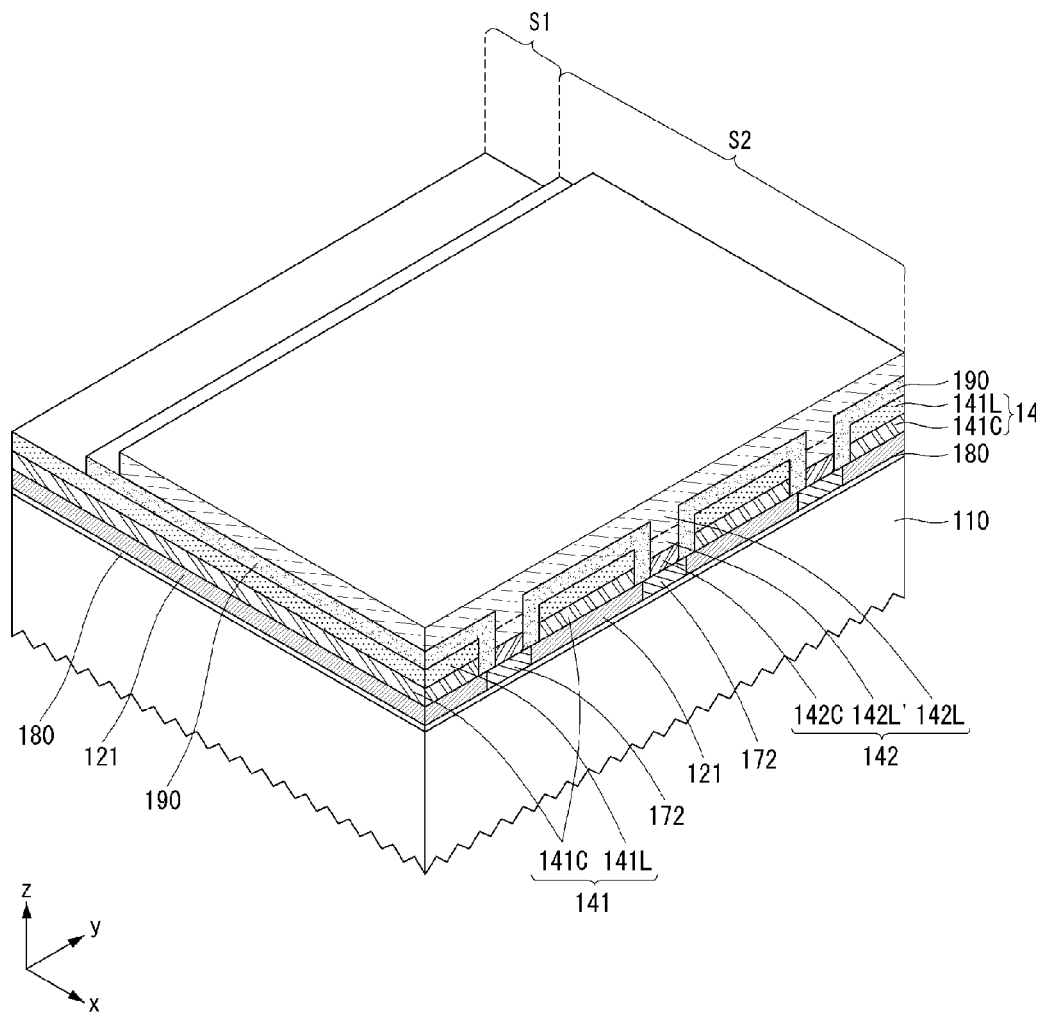
FIGS. 18 to 23 illustrate an example of a solar cell applicable to a solar cell module according to an example embodiment of the invention.
Figure 19:
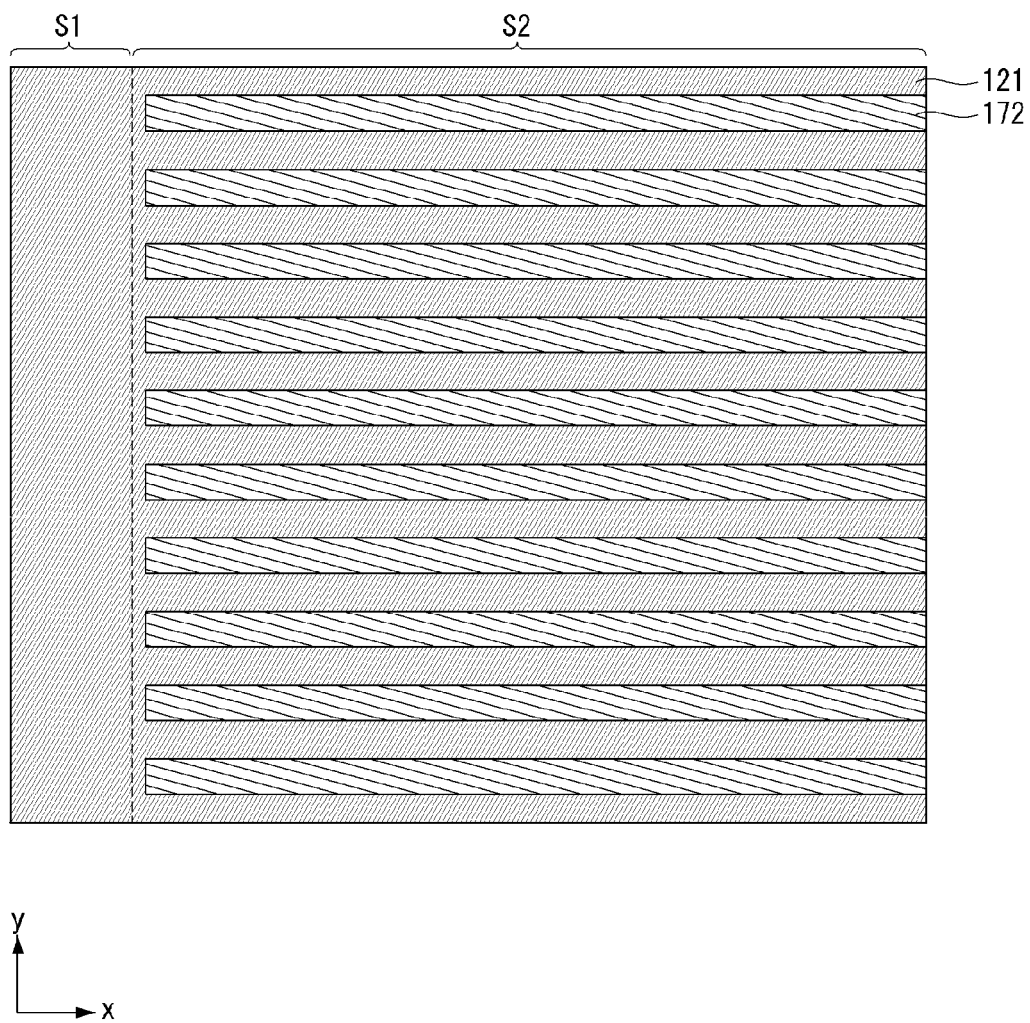
Figure 20:
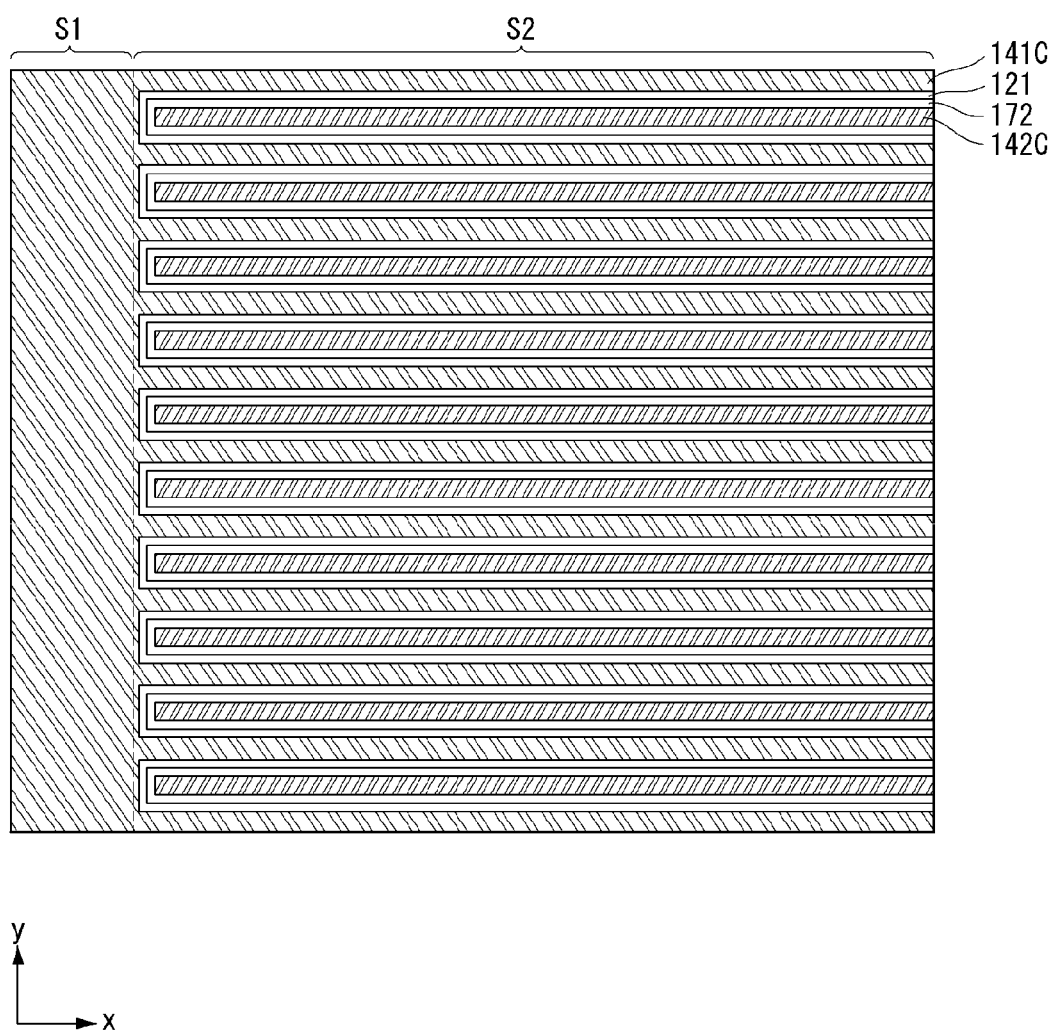
Figure 21:
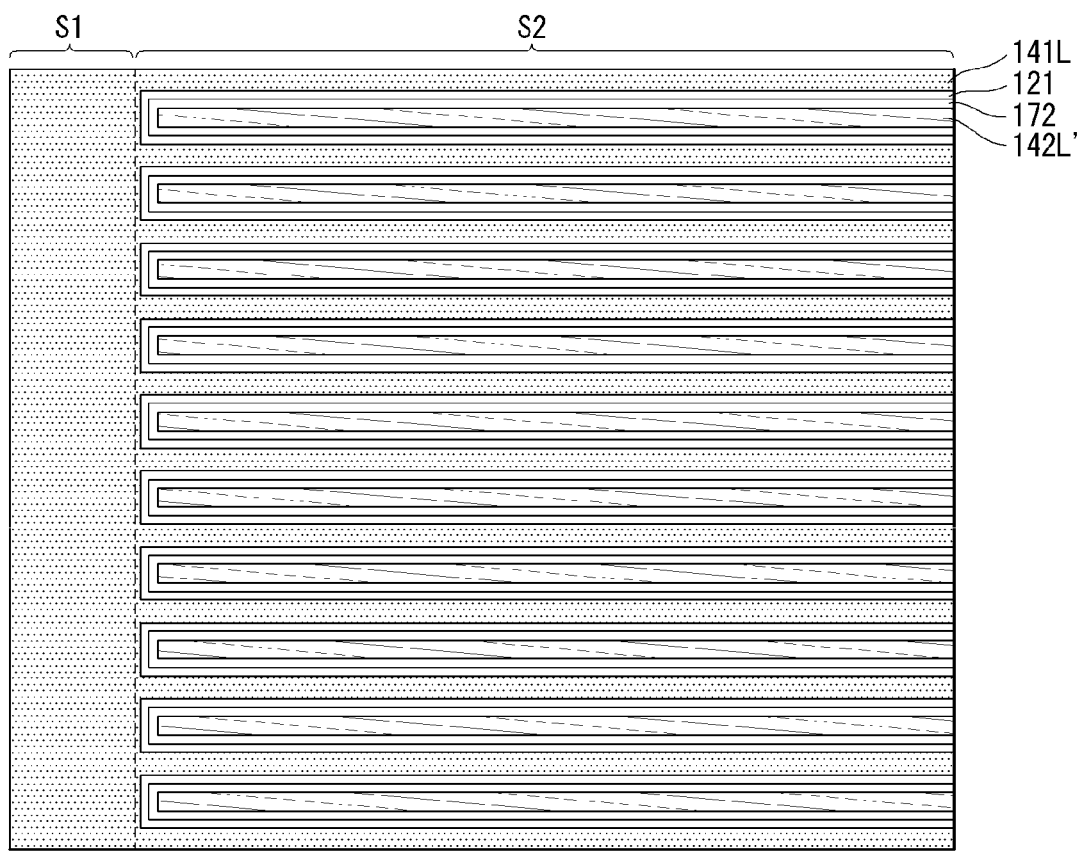
Figure 22:
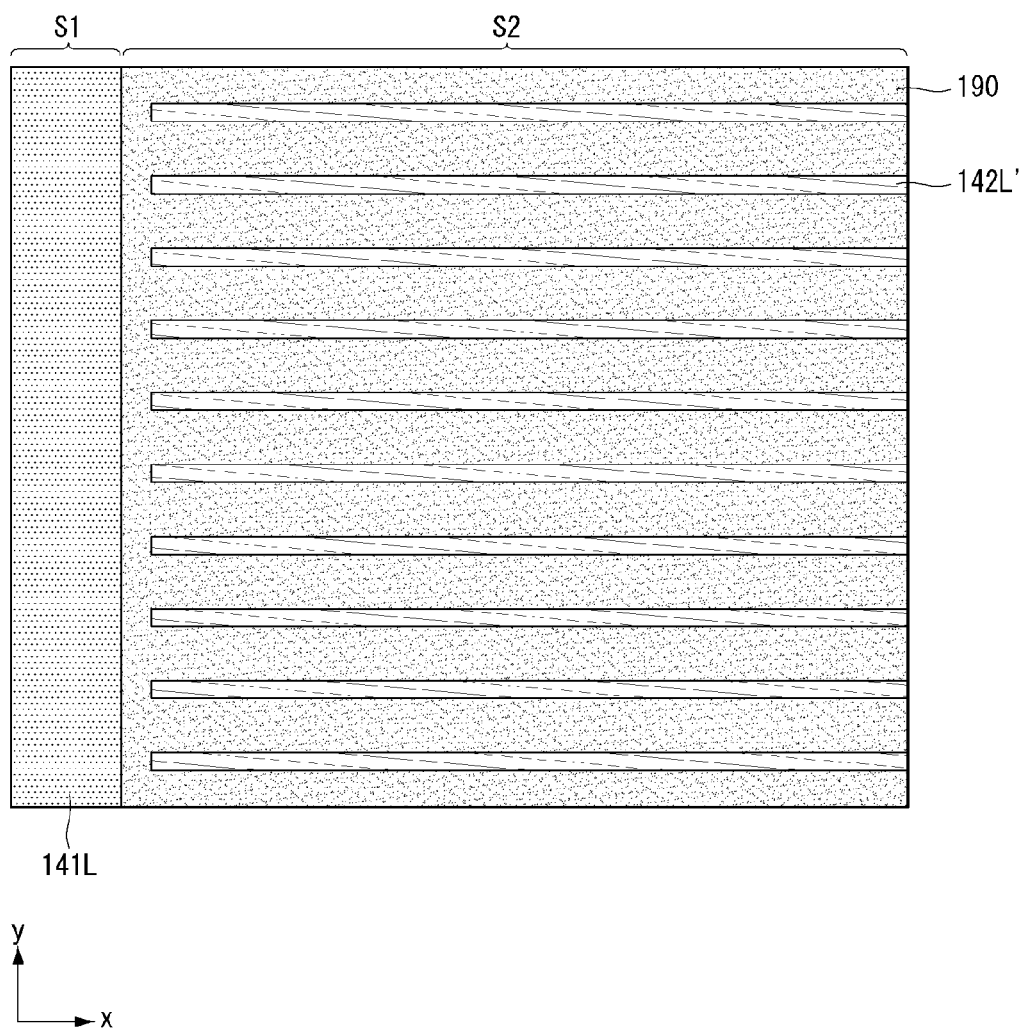
Figure 23:
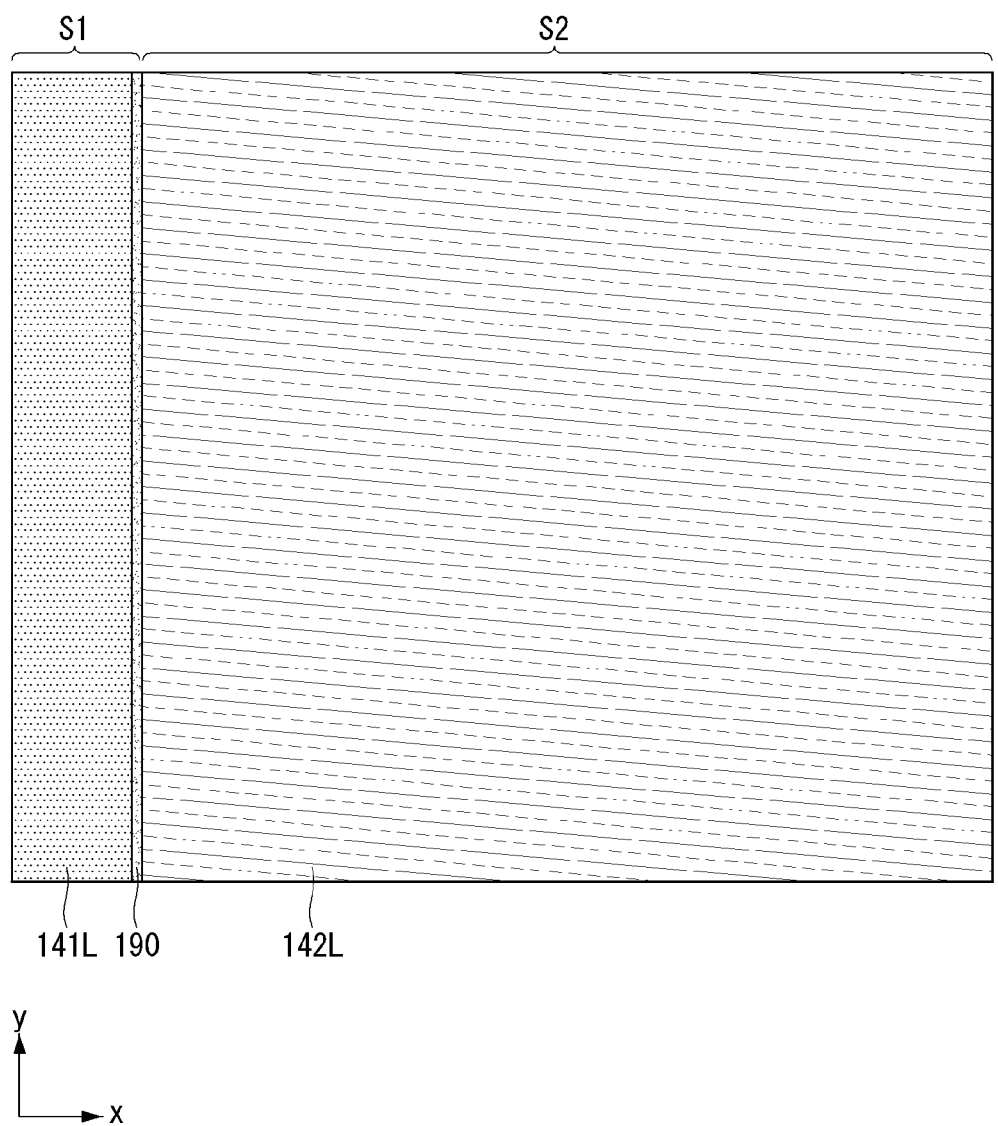

More specifically, FIG. 18 is a partial perspective view of a solar cell according to an embodiment; FIG. 19 is a plane view illustrating a pattern of first and second conductive regions 121 and 172 in the solar cell shown in FIG. 18; FIG. 20 is a plane view illustrating a pattern of first and second transparent electrode layers 141C and 142C in the solar cell shown in FIG. 18; FIG. 21 is a plane view illustrating a pattern of a first electrode layer 141L and a second auxiliary electrode 142L' in the solar cell shown in FIG. 18; FIG. 22 is a plane view illustrating a pattern of an insulating layer 190 in the solar cell shown in FIG. 18; and FIG. 23 is a plane view illustrating a pattern of a second electrode layer 142L in the solar cell shown in FIG. 18.

Since a semiconductor substrate 110, a tunnel layer 180, the first and second conductive regions 121 and 172, the first and second transparent electrode layers 141C and 142C, the insulating layer 190, the second auxiliary electrode 142L', and the first and second electrode layers 141L and 142L described with reference to FIGS. 18 to 23 are formed using the same material as the first and second embodiments of the invention, a further description may be briefly made or may be entirely omitted.

As shown in FIG. 18, a solar cell applicable to a solar cell module according to an embodiment of the invention may include a semiconductor substrate 110, a tunnel layer 180, first and second conductive regions 121 and 172, first and second transparent electrode layers 141C and 142C, an insulating layer 190, a second auxiliary electrode 142L', and first and second electrode layers 141L and 142L.

Since the semiconductor substrate 110 and the tunnel layer 180 shown in FIG. 18 are substantially the same as the first embodiment of the invention, a further description may be briefly made or may be entirely omitted.

As shown in FIGS. 18 and 19, the first and second conductive regions 121 and 172 may extend in the first direction x in a second area S2 of the semiconductor substrate 110 to form a stripe shape. Only the first conductive region 121 may extend in the second direction y in a first area S1 of the semiconductor substrate 110. The first conductive region 121 positioned in the first area S1 may be connected to the plurality of first conductive regions 121 positioned in the second area S2.

FIGS. 18 and 19 illustrate that the first and second conductive regions 121 and 172 are directly connected to each other in the second area S2 of the semiconductor substrate 110, as an example. However, the first and second conductive regions 121 and 172 may be spatially separated from each other, and intrinsic silicon material or the insulating layer 190 may be filled in a separation space between the first and second conductive regions 121 and 172.

As shown in FIGS. 18 and 20, the first and second transparent electrode layers 141C and 142C may respectively overlap the first and second conductive regions 121 and 172 in the second area S2 of the semiconductor substrate 110 and extend in the first direction x to form a stripe shape. The first and second transparent electrode layers 141C and 142C may be separated from each other in the second area S2 of the semiconductor substrate 110.

In FIG. 20, the insulating layer 190 may be filled in a separation space between the first and second transparent electrode layers 141C and 142C.

Only the first transparent electrode layer 141C may be positioned on the first conductive region 121 in the first area S1 of the semiconductor substrate 110 and may extend in the second direction y. In this instance, the first transparent electrode layer 141C extending in the second direction y in the first area S1 of the semiconductor substrate 110 and the plurality of first transparent electrode layers 141C extending in the first direction x in the second area S2 of the semiconductor substrate 110 may be connected to form one body.

As shown in FIGS. 18 and 21, the first electrode layer 141L may overlap the first transparent electrode layer 141C and may extend in the first direction x in the second area S2 of the semiconductor substrate 110 to form a stripe shape. The first electrode layer 141L may extend in the second direction y in the first area S1 of the semiconductor substrate 110 and may be connected to the first electrode layer 141L positioned in the second area S2 of the semiconductor substrate 110 to form one body.

As shown in FIG. 18, the second auxiliary electrode 142L' may overlap the second transparent electrode layer 142C. As shown in FIG. 21, the second auxiliary electrode 142L' may be separated from the first electrode layer 141L in the second area S2 of the semiconductor substrate 110 and may extend in the first direction x to form a stripe shape.

Further, as shown in FIG. 18, the insulating layer 190 may be filled in a separation space between the first electrode layer 141L and the second auxiliary electrode 142L'.

As shown in FIGS. 18 and 22, the insulating layer 190 may be configured such that the first area S1 of the semiconductor substrate 110 is exposed, and the insulating layer 190 covers the second area S2 of the semiconductor substrate 110. Further, the insulating layer 190 may be formed on the first electrode layer 141L except the second auxiliary electrode 142L', so that the second auxiliary electrode 142L' is exposed to the second area S2 of the semiconductor substrate 110.

As shown in FIGS. 18 and 23, the second electrode layer 142L may be configured to entirely cover the insulating layer 190 and the second auxiliary electrode 142L' positioned in the second area S2 of the semiconductor substrate 110. The second electrode layer 142L may be electrically connected to the second auxiliary electrode 142L' positioned in the second area S2 of the semiconductor substrate 110 and may be insulated from the first electrode layer 141L.

The first electrode layer 141L exposed to the first area S1 may serve as a first electrode pad, and the second electrode layer 142L exposed to the second area S2 may serve as a second electrode pad.

Hence, the interconnector described in the first and second embodiments of the invention and the modified examples thereof may be applied to the solar cell illustrated in FIGS. 18 to 23.

FIGS. 24 to 29 illustrate another example of a solar cell applicable to a solar cell module according to an example embodiment of the invention.

Figure 24:
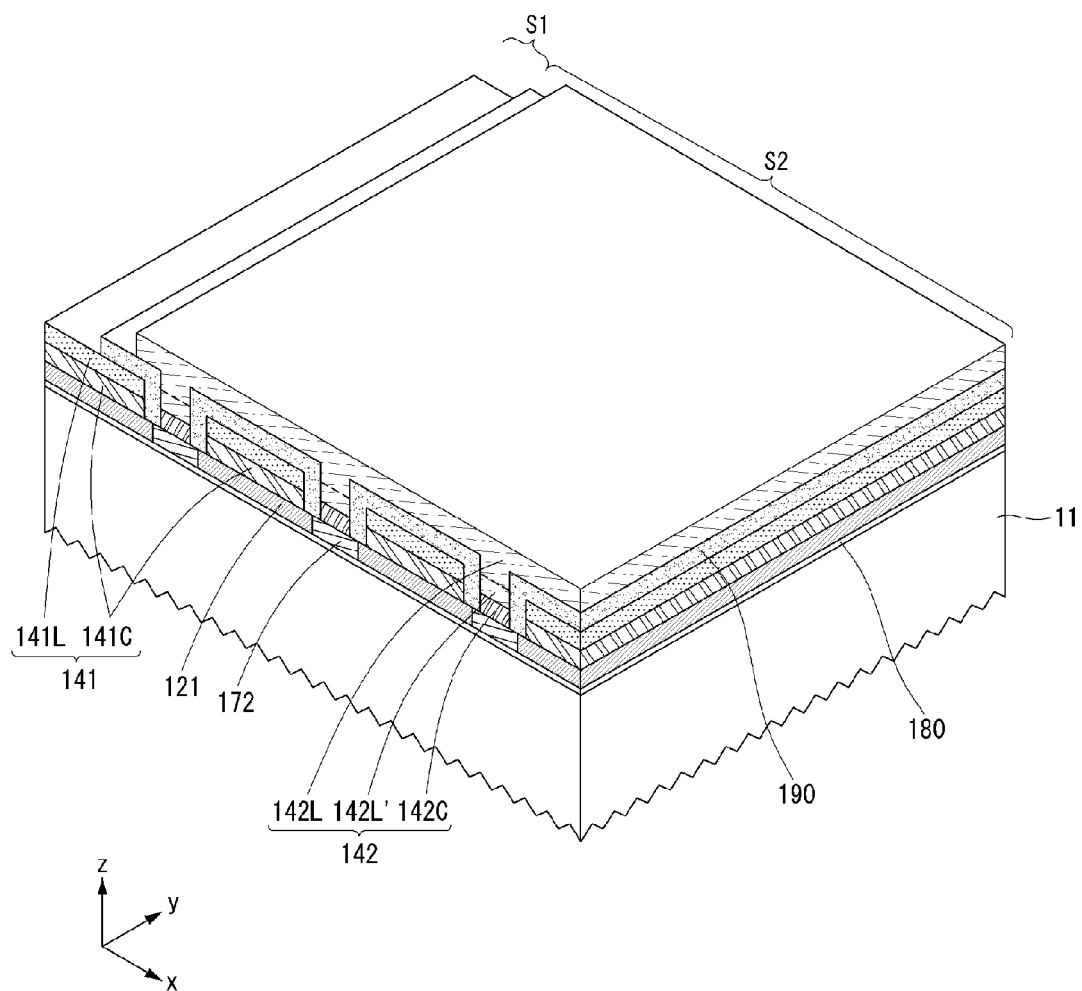
FIGS. 24 to 29 illustrate another example of a solar cell applicable to a solar cell module according to an example embodiment of the invention.
Figure 25:
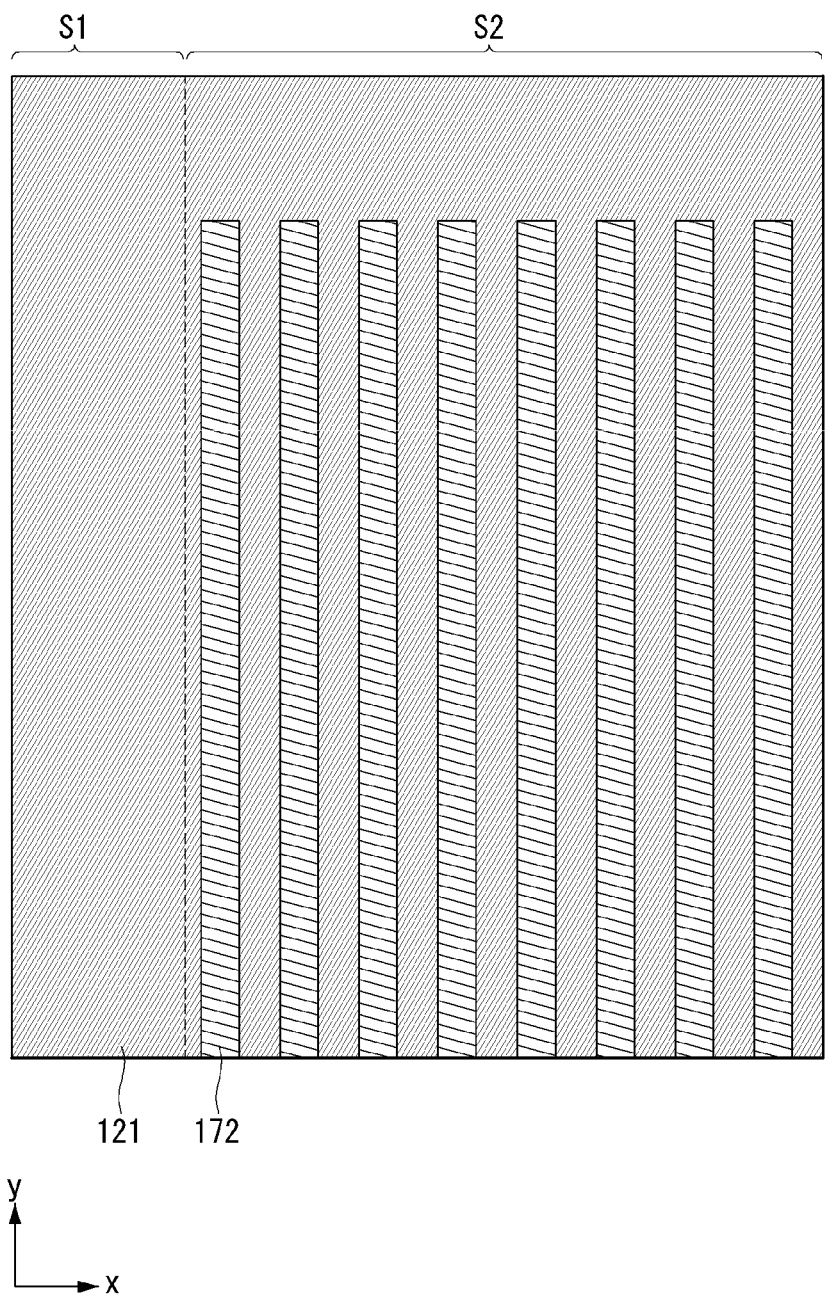
Figure 26:
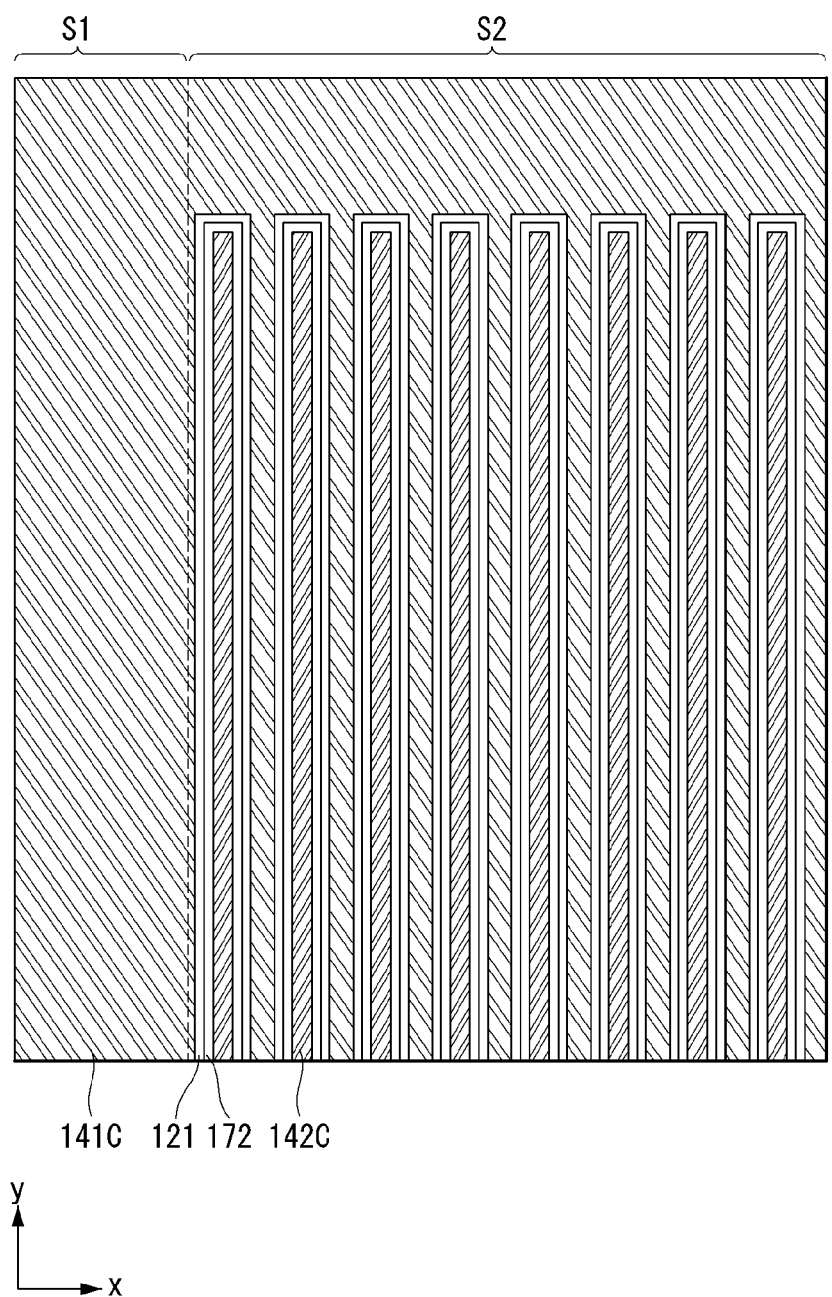
Figure 27:
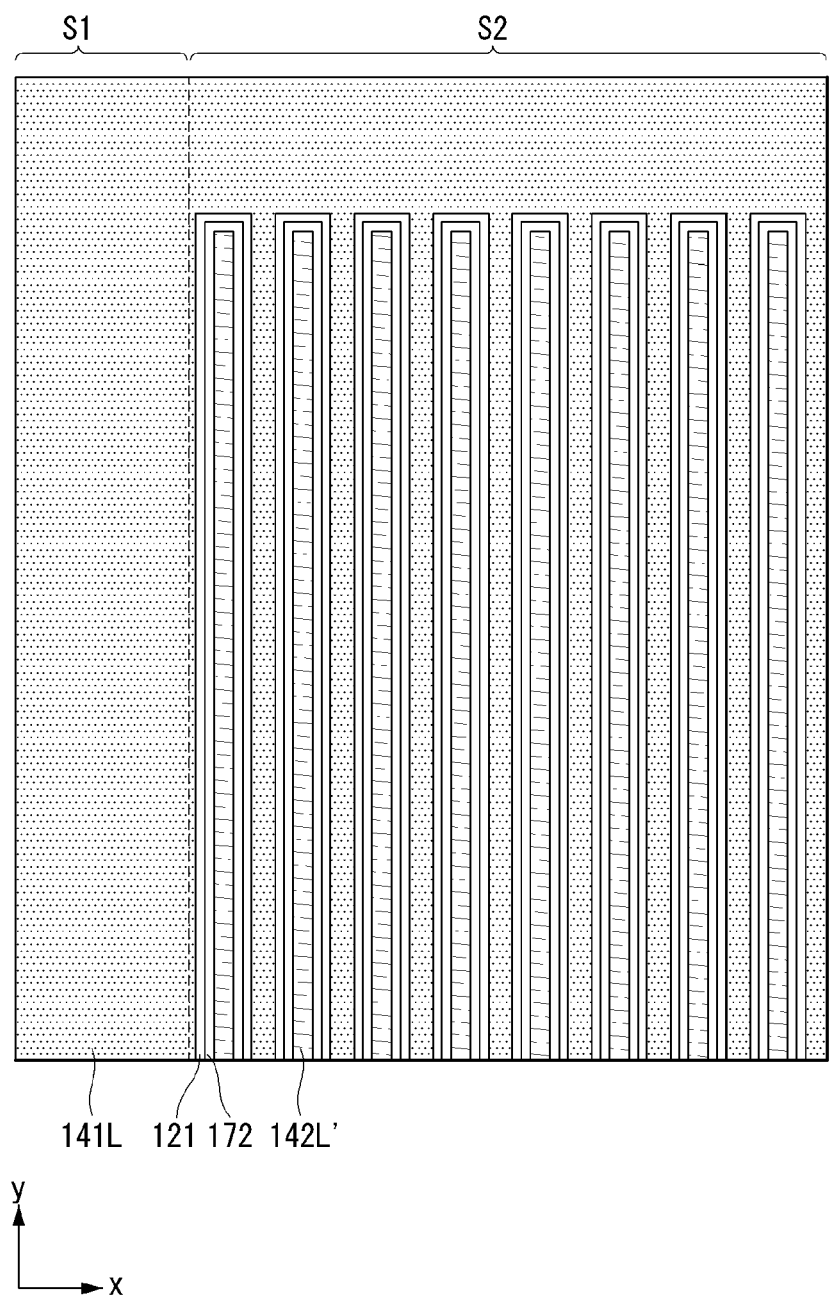
Figure 28:
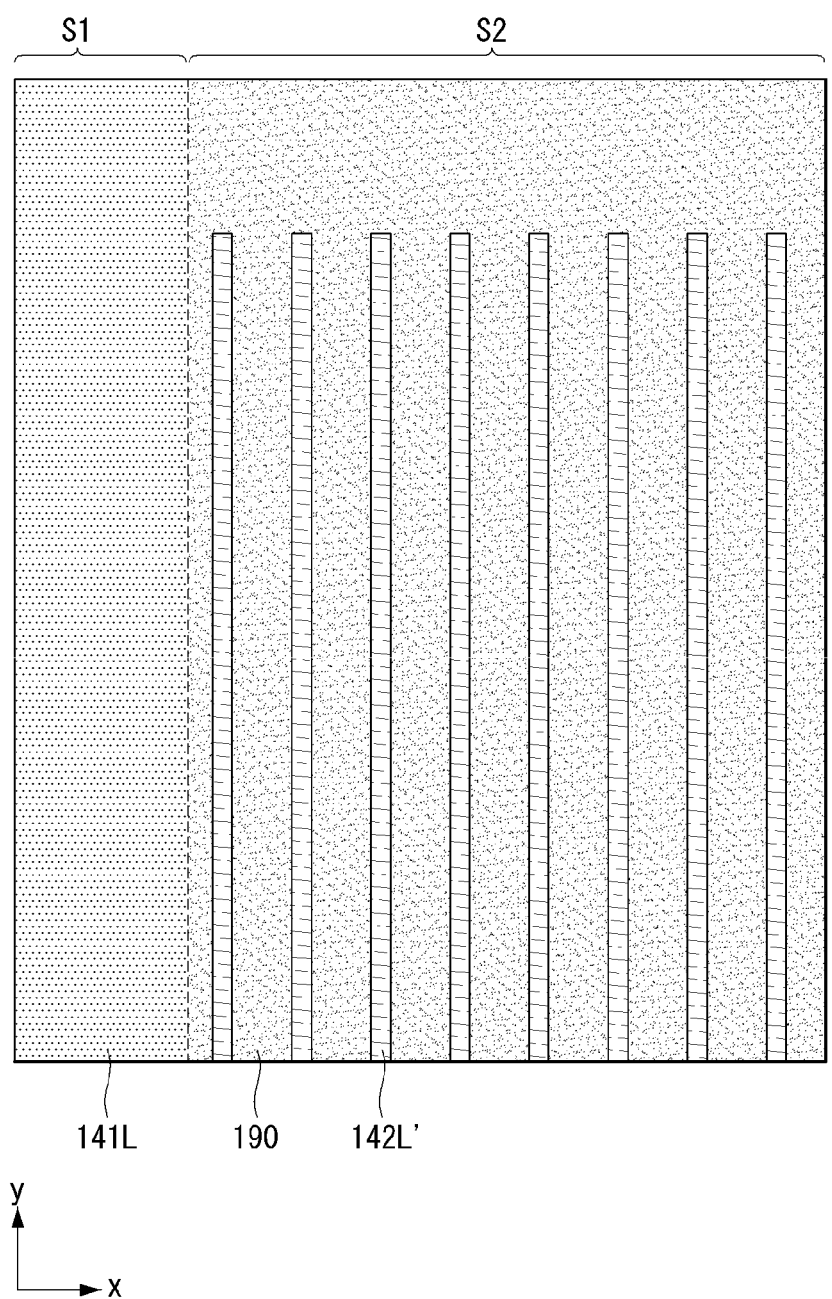
Figure 29:
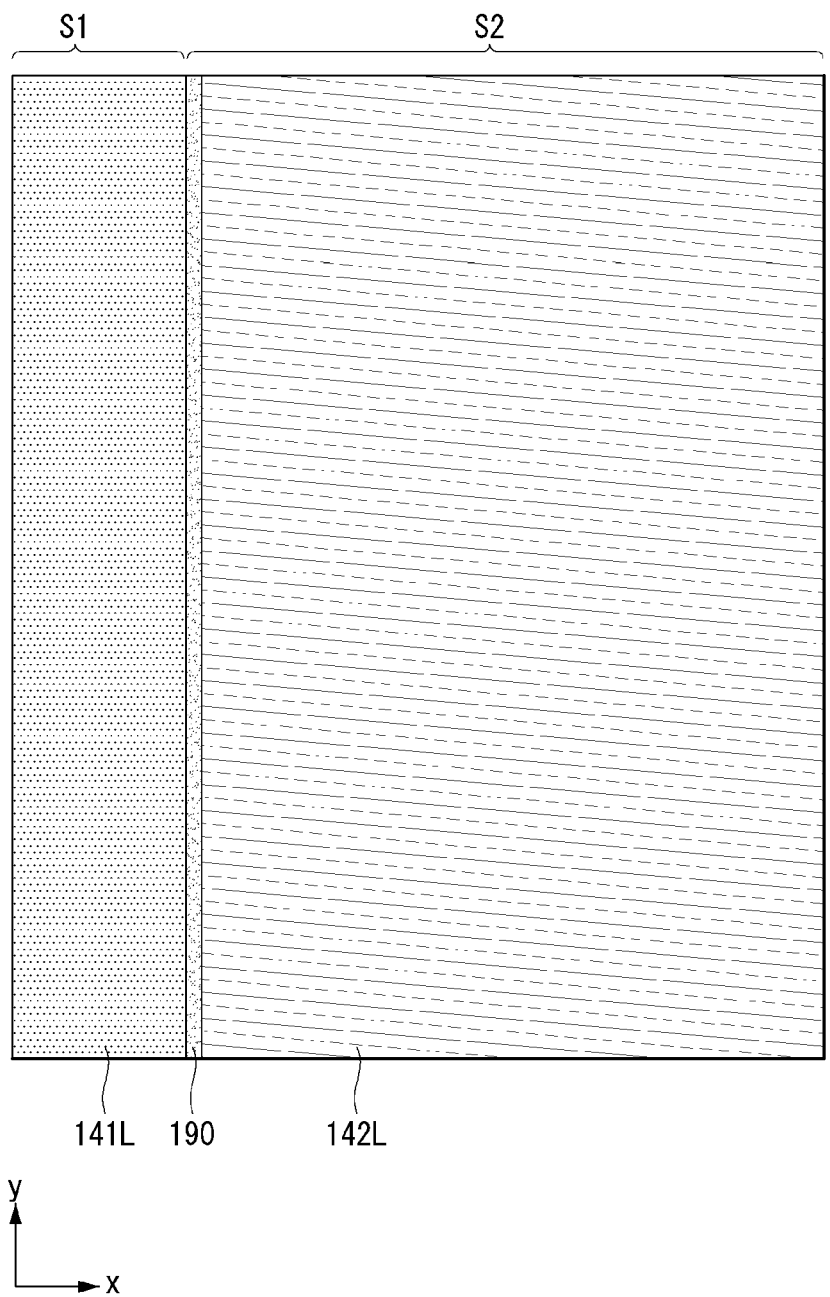

More specifically, FIG. 24 is a partial perspective view of a solar cell according to an embodiment; FIG. 25 is a plane view illustrating a pattern of first and second conductive regions 121 and 172 in the solar cell shown in FIG. 24; FIG. 26 is a plane view illustrating a pattern of first and second transparent electrode layers 141C and 142C in the solar cell shown in FIG. 24; FIG. 27 is a plane view illustrating a pattern of a first electrode layer 141L and a second auxiliary electrode 142L' in the solar cell shown in FIG. 24; FIG. 28 is a plane view illustrating a pattern of an insulating layer 190 in the solar cell shown in FIG. 24; and FIG. 29 is a plane view illustrating a pattern of a second electrode layer 142L in the solar cell shown in FIG. 24.

Since a semiconductor substrate 110, a tunnel layer 180, the first and second conductive regions 121 and 172, the first and second transparent electrode layers 141C and 142C, the insulating layer 190, the second auxiliary electrode 142L', and the first and second electrode layers 141L and 142L described with reference to FIGS. 24 to 29 are formed using the same material as the first and second embodiments of the invention, a further description may be briefly made or may be entirely omitted.

As shown in FIGS. 24 and 25, the first conductive region 121 may extend in the second direction y in first and second areas S1 and S2 of the semiconductor substrate 110 to form a stripe shape. The first conductive region 121 extending in the second direction y may be connected to the first conductive region 121 extending in the first direction x at one end of the second area S2 parallel to the first direction x.

A width of the first conductive region 121 extending in the second direction y in the first area S1 may be greater than a width of the first area S1 and may be greater than a width of the first conductive region 121 extending in the second direction y in the second area S2.

Further, the second conductive region 172 may extend in the second direction y in the second area S2 of the semiconductor substrate 110 to form a stripe shape. The first conductive regions 121 and the second conductive regions 172 may be alternately arranged along the first direction x.

FIGS. 24 and 25 illustrate that the first and second conductive regions 121 and 172 are directly connected to each other in the second area S2 of the semiconductor substrate 110, as an example. However, the first and second conductive regions 121 and 172 may be spatially separated from each other, and intrinsic silicon material or the insulating layer 190 may be filled in a separation space between the first and second conductive regions 121 and 172.

As shown in FIGS. 24 and 26, the first and second transparent electrode layers 141C and 142C may respectively overlap the first and second conductive regions 121 and 172 in the first and second areas S1 and S2 of the semiconductor substrate 110.

A portion of the first transparent electrode layer 141C may extend in the second direction y to form a stripe shape. As shown in FIG. 24, the insulating layer 190 may be filled in a separation space between the first and second transparent electrode layers 141C and 142C.

The first transparent electrode layer 141C extending in the second direction y may be connected to the first transparent electrode layer 141C extending in the first direction x at one end of the second area S2 parallel to the first direction x.

A width of the first transparent electrode layer 141C extending in the second direction y in the first area S1 may be greater than a width of the first area S1 and may be greater than a width of the first transparent electrode layer 141C extending in the second direction y in the second area S2.

Further, the second transparent electrode layer 142C may extend in the second direction y in the second area S2 of the semiconductor substrate 110 to form a stripe shape. The first transparent electrode layers 141C and the second transparent electrode layers 142C may be separated from each other and alternately arranged along the first direction x.

As shown in FIGS. 24 and 27, the first electrode layer 141L may overlap the first transparent electrode layer 141C, may be formed in the first and second areas S1 and S2, and may have the same pattern as the first transparent electrode layer 141C. The second auxiliary electrode 142L' may overlap the second transparent electrode layer 142C in the second area S2 and may have the same pattern as the second transparent electrode layer 142C.

Further, as shown in FIG. 24, the insulating layer 190 may be filled in a separation space between the first electrode layer 141L and the second auxiliary electrode 142L'.

As shown in FIGS. 24 and 28, the insulating layer 190 may be configured such that the first area S1 of the semiconductor substrate 110 is exposed and the insulating layer 190 covers the second area S2 of the semiconductor substrate 110. Further, the insulating layer 190 may be formed on the first electrode layer 141L except the second auxiliary electrode 142L', so that the second auxiliary electrode 142L' is exposed to the second area S2 of the semiconductor substrate 110.

As shown in FIGS. 24 and 29, the second electrode layer 142L may be configured to entirely cover the insulating layer 190 and the second auxiliary electrode 142L' positioned in the second area S2 of the semiconductor substrate 110. The second electrode layer 142L may be electrically connected to the second auxiliary electrode 142L' positioned in the second area S2 of the semiconductor substrate 110 and may be insulated from the first electrode layer 141L.

The first electrode layer 141L exposed to the first area S1 may serve as a first electrode pad, and the second electrode layer 142L exposed to the second area S2 may serve as a second electrode pad.

Hence, the interconnector described in the first and second embodiments of the invention and the modified examples thereof may be applied to the solar cell illustrated in FIGS. 25 to 29.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
   a semiconductor substrate containing a crystalline silicon material and including two first edges extending in a first direction and two second edges extending in a second direction crossing the first direction;
   a first conductive region on a back surface of the semiconductor substrate;
   a second conductive region positioned in a portion except the first conductive region from the back surface of the semiconductor substrate and having a conductive type opposite the first conductive region;
   a first electrode connected to the first conductive region; and
   a second electrode connected to the second conductive region,
   wherein the back surface of the semiconductor substrate is divided into a first area and a second area, the first area including one second edge of the two second edges of the back surface of the semiconductor substrate and the second area including a portion except the first area from the back surface of the semiconductor substrate, and another second edge of the two second edges,
   wherein the one second edge and the another second edge are positioned opposite to each other in the back surface of the semiconductor substrate, and an insulating layer is positioned at the second area,
   wherein the first electrode is formed in the first and second areas, and a portion of the first electrode is exposed at the first area, and
   wherein the second electrode is separated from the first electrode in the second area and is exposed at the second area,
   wherein the insulating layer is positioned between the first electrode and second electrode in the second area of the semiconductor substrate, and wherein the insulating layer protrudes further toward the one second edge of the two second edges than the second electrode.

2. The solar cell of claim 1, wherein the first electrode includes a first electrode layer that is entirely formed in the first and second areas and includes a plurality of openings in the second area, and
   wherein the second electrode includes a second electrode layer that is connected to the second conductive region through the plurality of openings of the first electrode layer of the second area, is separated from the first electrode layer of the second area, and is stacked on the first electrode layer of the second area in a plane shape.

3. The solar cell of claim 2, wherein a portion of the first electrode layer is exposed to at least a portion of the first area, and
   wherein the second electrode layer is formed in at least a portion of the second area.

4. The solar cell of claim 2, wherein the first electrode further includes a first transparent electrode layer between the first electrode layer and the first conductive region, and
   wherein the second electrode further includes a plurality of second transparent electrode layers between the second electrode layer and the second conductive region.

5. The solar cell of claim 4, wherein the first electrode layer and the first transparent electrode layer have the same pattern when viewed from a plane of the semiconductor substrate.

6. The solar cell of claim 4, wherein one of the plurality of second transparent electrode layers is formed inside an opening of the first transparent electrode layer positioned in the second area and is connected to the second conductive region.

7. The solar cell of claim 4, wherein the insulating layer is positioned on the first transparent electrode layer of the second area of the semiconductor substrate and the insulating layer has a plurality of openings to expose the plurality of second transparent electrode layers.

8. The solar cell of claim 4, wherein the plurality of second transparent electrode layers are separated from one another to have a lattice arrangement.

9. The solar cell of claim 1, wherein the first conductive region is entirely formed in the first and second areas and includes a plurality of openings in the second area, and
   wherein the second conductive region is formed inside the plurality of openings of the first conductive region positioned in the second area.

10. The solar cell of claim 9, wherein the first and second conductive regions each include one of an amorphous silicon, a single crystal silicon, a polycrystalline silicon, or a metal oxide.

11. The solar cell of claim 7, wherein the insulating layer is positioned in a space between the first electrode layer and the second electrode layer that are separated from each other and are stacked in the second area.

12. The solar cell of claim 7, further comprising a tunnel layer between the entire back surface of the semiconductor substrate and front surfaces of the first and second conductive regions, so that carriers produced in the semiconductor substrate pass through the tunnel layer.

13. The solar cell of claim 12, wherein a thickness of the insulating layer is greater than a thickness of the tunnel layer.

14. The solar cell of claim 4, wherein the first and second transparent electrode layers each include a transparent conductive oxide.

15. The solar cell of claim 4, wherein the first and second transparent electrode layers each have a thickness of 10 nm to 100 nm.

16. The solar cell of claim 4, wherein a thickness of each of the first and second electrode layers is greater than a thickness of each of the first and second transparent electrode layers and is 100 nm to 5 μm.

17. The solar cell of claim 4, wherein the first conductive region is entirely formed in the first area and formed in the second area in one extended direction, and
   wherein the second conductive region is formed in the second area in parallel with the first conductive region and the first area.

18. The solar cell of claim 17, wherein the first transparent electrode layer is connected to the first conductive region while overlapping the first conductive region, is entirely formed in the first area, and extends in one direction in the second area, and
   wherein the second transparent electrode layer is connected to the second conductive region while overlapping the second conductive region in the second area, and is separated from the first transparent electrode layer.

19. A solar cell module comprising:
   a plurality of solar cells each having a structure according to claim 1 and arranged in the first direction; and
   an interconnector connecting first and second solar cells, that are adjacently arranged in the first direction among the plurality of solar cells, in series to each other,
   wherein one end of the interconnector is connected to a portion of the first electrode exposed to a first area of the first solar cell while overlapping the portion of the first electrode, and the other end of the interconnector is connected to the second electrode exposed to a second area of the second solar cell while overlapping the second electrode.

20. The solar cell module of claim 19, wherein a length of the interconnector, in the first direction, overlapping the first area of the first solar cell is different from a length of the interconnector, in the first direction, overlapping the second area of the second solar cell.

21. The solar cell module of claim 19, wherein the first and second electrodes respectively include first and second electrode layers that are separated from each other and are stacked in a plane shape,
   wherein the interconnector includes a first direction conductor extending in the first direction, and
   wherein one end of the first direction conductor is connected to the first electrode layer exposed to the first area of the first solar cell, and the other end of the first direction conductor is connected to the second electrode layer formed in the second area of the second solar cell.

22. The solar cell module of claim 21, wherein the first direction conductor is a plurality of first direction conductors, and
   wherein an overlap length between one end of one of the plurality of first direction conductors and the first area of the first solar cell is different from an overlap length between the other end of the one first direction conductor and the second area of the second solar cell.

23. The solar cell module of claim 22, wherein the interconnector further includes two second direction conductors that are extended in the second direction crossing the first direction from both ends of the first direction conductor, and wherein the first and second direction conductors are formed as one body.

24. The solar cell module of claim 23, wherein the two second direction conductors are connected respectively to both ends of the first direction conductor and have the same width.

25. The solar cell module of claim 21, wherein one first direction conductor is provided, and
wherein a width of one of the two second direction conductors connected respectively to both ends of the first direction conductor is different from a width of the other of the two second direction conductors.

26. The solar cell module of claim 19, wherein the second electrode of each of the first and second solar cells is exposed to a portion of the second area.

27. The solar cell module of claim 26, wherein the insulating layer covers a remaining portion except a portion that the second electrode is exposed, from the second area of a semiconductor substrate.

28. The solar cell module of claim 27, wherein the interconnector has a plane shape,
wherein one end of the interconnector of the plane shape is connected to a first electrode layer exposed to the first area of one of the first and second solar cells, and
wherein the other end of the interconnector is connected to a portion of a second electrode layer exposed to a portion of the second area of the other solar cell.

29. The solar cell module of claim 28, wherein the interconnector of the plane shape includes a plurality of openings in a portion not overlapping the first and second solar cells.

* * * * *